US012772494B2

(12) United States Patent
Henson et al.

(10) Patent No.: US 12,772,494 B2
(45) Date of Patent: Oct. 20, 2026

(54) TRANSISTOR DEVICE HAVING A TERMINATION REGION AND METHOD OF PRODUCING THE TRANSISTOR DEVICE

(71) Applicant: Infineon Technologies Austria AG, Villach (AT)

(72) Inventors: Timothy Henson, Mount Shasta, CA (US); Adam Amali, Chandler, AZ (US); Kishore Lakhmichand Malani, San Diego, CA (US); Robert Haase, San Pedro, CA (US)

(73) Assignee: Infineon Technologies Austria AG, Villach (AT)

( * ) Notice: Subject to any disclaimer, the term of this patent is extended or adjusted under 35 U.S.C. 154(b) by 351 days.

(21) Appl. No.: 18/610,996

(22) Filed: Mar. 20, 2024

(65) Prior Publication Data

US 2025/0301697 A1 Sep. 25, 2025

(51) Int. Cl.
*H10D 30/66* (2025.01)
*H10D 30/01* (2025.01)
(Continued)

(52) U.S. Cl.
CPC ....... *H10D 30/665* (2025.01); *H10D 30/0297* (2025.01); *H10D 30/668* (2025.01);
(Continued)

(58) Field of Classification Search
None
See application file for complete search history.

(56) References Cited

U.S. PATENT DOCUMENTS 10,714,603 B2 * 7/2020 Naito .................. H10D 12/481
11,069,771 B2 7/2021 Nakagawa et al.
(Continued)

FOREIGN PATENT DOCUMENTS

JP 2016189369 A 11/2016

OTHER PUBLICATIONS

Liu, Janifer, et al., "Super Junction by Implant through Trench Contact for Low Voltage Power MOSFET and IGBT", 2021 China Semiconductor Technology International Conference (CSTIC), 2021, 1-3.

*Primary Examiner* — Bilkis Jahan
(74) *Attorney, Agent, or Firm* — Murphy, Bilak & Homiller, PLLC

(57) ABSTRACT

A transistor device includes: a semiconductor substrate having a termination region interposed between a first active cell region and an edge of the semiconductor substrate; and transistor cells in the first active cell region, each transistor cell including a gate trench formed in a body region of a first conductivity type. The body region extends into the termination region. The termination region includes: a first termination trench laterally surrounding the first active cell region and extending through the body region so that the body region is interrupted in the termination region by the first termination trench; and a first doped region of the first conductivity type that follows the first termination trench and adjoins part of a bottom of the first termination trench. The first doped region terminates deeper in the semiconductor substrate than the body region and is off-center to a longitudinal centerline of the first termination trench.

23 Claims, 18 Drawing Sheets

(51) Int. Cl.
*H10D 62/10* (2025.01)
*H10D 64/00* (2025.01)
*H10P 30/20* (2026.01)
*H10P 30/22* (2026.01)

(52) U.S. Cl.
CPC ......... *H10D 62/107* (2025.01); *H10D 62/111* (2025.01); *H10D 62/127* (2025.01); *H10D 64/117* (2025.01); *H10P 30/204* (2026.01); *H10P 30/21* (2026.01); *H10P 30/22* (2026.01)

(56) References Cited

U.S. PATENT DOCUMENTS

| | | | | |
|---|---|---|---|---|
| 11,201,210 | B2 | 12/2021 | Kyogoku et al. | |
| 2007/0114599 | A1 | 5/2007 | Hshieh | |
| 2008/0185643 | A1* | 8/2008 | Hossain ............... | H10D 62/111 257/E29.198 |
| 2009/0014787 | A1 | 1/2009 | Wang | |
| 2010/0224932 | A1 | 9/2010 | Takaya et al. | |
| 2011/0121386 | A1* | 5/2011 | Hsieh ..................... | H10B 41/42 257/334 |
| 2011/0254086 | A1 | 10/2011 | Hsieh | |
| 2013/0313635 | A1 | 11/2013 | Nakano | |
| 2014/0374882 | A1 | 12/2014 | Siemieniec et al. | |
| 2016/0155794 | A1* | 6/2016 | Kim ..................... | H10D 64/117 438/135 |
| 2016/0284814 | A1* | 9/2016 | Grivna ................. | H10D 12/032 |
| 2017/0133518 | A1* | 5/2017 | Li ........................ | H10D 30/871 |
| 2017/0330932 | A1 | 11/2017 | Sugai et al. | |
| 2022/0077312 | A1* | 3/2022 | Hoshi .................. | H10D 30/665 |
| 2023/0100307 | A1 | 3/2023 | Sun | |
| 2023/0411512 | A1 | 12/2023 | Shimomura et al. | |
| 2024/0047517 | A1 | 2/2024 | Haase et al. | |

* cited by examiner

TRANSISTOR DEVICE HAVING A TERMINATION REGION AND METHOD OF PRODUCING THE TRANSISTOR DEVICE

BACKGROUND

Power semiconductor transistors typically have one or more active cell regions that are laterally spaced inward from the edge of the semiconductor substrate used to fabricate the device, and a termination region interposed between each active cell region and the edge of the semiconductor substrate. Each active cell region includes the transistor cells that support the main current flow path of the transistor, each transistor cell has a gate structure for controlling current flow through the cell. The termination region must support the breakdown voltage of the transistor device while also providing a lateral transition of the high potential near the edge of the semiconductor substrate to a low potential in each active cell region. For example, the termination region of a 30V rated MOSFET (metal-oxide-semiconductor field-effect transistor) power transistor supports a voltage of about 34V near the edge of the semiconductor substrate and must drop the 34V to about 0V in each active cell region. For power transistor designs that utilize a blanket implant to form the body region of the device, the body region is also present in the termination region which may complicate the design of the termination structure included in the termination region.

Thus, there is a need for an improved termination region for power transistors having a blanket implanted body region.

SUMMARY

According to an embodiment of a transistor device, the transistor device comprises: a semiconductor substrate comprising a termination region interposed between a first active cell region and an edge of the semiconductor substrate; and a plurality of transistor cells in the first active cell region, each transistor cell comprising a gate trench formed in a body region of a first conductivity type; wherein the body region extends into the termination region, wherein the termination region comprises: a first termination trench laterally surrounding the first active cell region and extending through the body region so that the body region is interrupted in the termination region by the first termination trench; and a first doped region of the first conductivity type that follows the first termination trench and adjoins part of a bottom of the first termination trench, the first doped region terminating deeper in the semiconductor substrate than the body region and being off-center to a longitudinal centerline of the first termination trench.

According to an embodiment of a method of producing a transistor device, the method comprises: blanket implanting a body region of a first conductivity type into a first active cell region and a termination region of a semiconductor substrate, the termination region being interposed between the first active cell region and an edge of the semiconductor substrate; forming a plurality of transistor cells in the first active cell region, each transistor cell comprising a gate trench formed in the body region; forming, in the termination region, a first termination trench that laterally surrounds the first active cell region and extends through the body region so that the body region is interrupted in the termination region by the first termination trench; and forming a first doped region of the first conductivity type that follows the first termination trench and adjoins part of a bottom of the first termination trench, the first doped region terminating deeper in the semiconductor substrate than the body region and being off-center with reference to a longitudinal centerline of the first termination trench.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

The embodiments described herein provide a termination region design for power transistors that have a blanket implanted body region. The termination region supports the breakdown voltage of the power transistor while also providing a lateral transition of a high potential near the edge of the semiconductor substrate to a low potential in each active cell region of the device. The termination region includes at least one termination trench that laterally surrounds each active cell region that supports the main current flow path of the transistor. Each termination trench extends through the blanket implanted body region so that the body region is interrupted in the termination region by each termination trench, which helps to laterally transition a high potential near the edge of the semiconductor substrate to a low potential in each active cell region of the device. The termination region also includes a doped potential drop region of the same conductivity type as the body region and that follows each termination trench and adjoins part of a bottom of the corresponding termination trench. Each doped potential drop region terminates deeper in the semiconductor substrate than the body region and is off-center to a longitudinal centerline of the adjacent termination trench. The innermost doped potential drop region may extend into other regions of the device, e.g., such as where gate electrode connections are formed between adjacent active cell regions.

Described next with reference to the figures are embodiments of the termination trenches with the adjoining off-center doped region and methods of producing the termination trenches with the adjoining off-center doped region.

Figure 1:
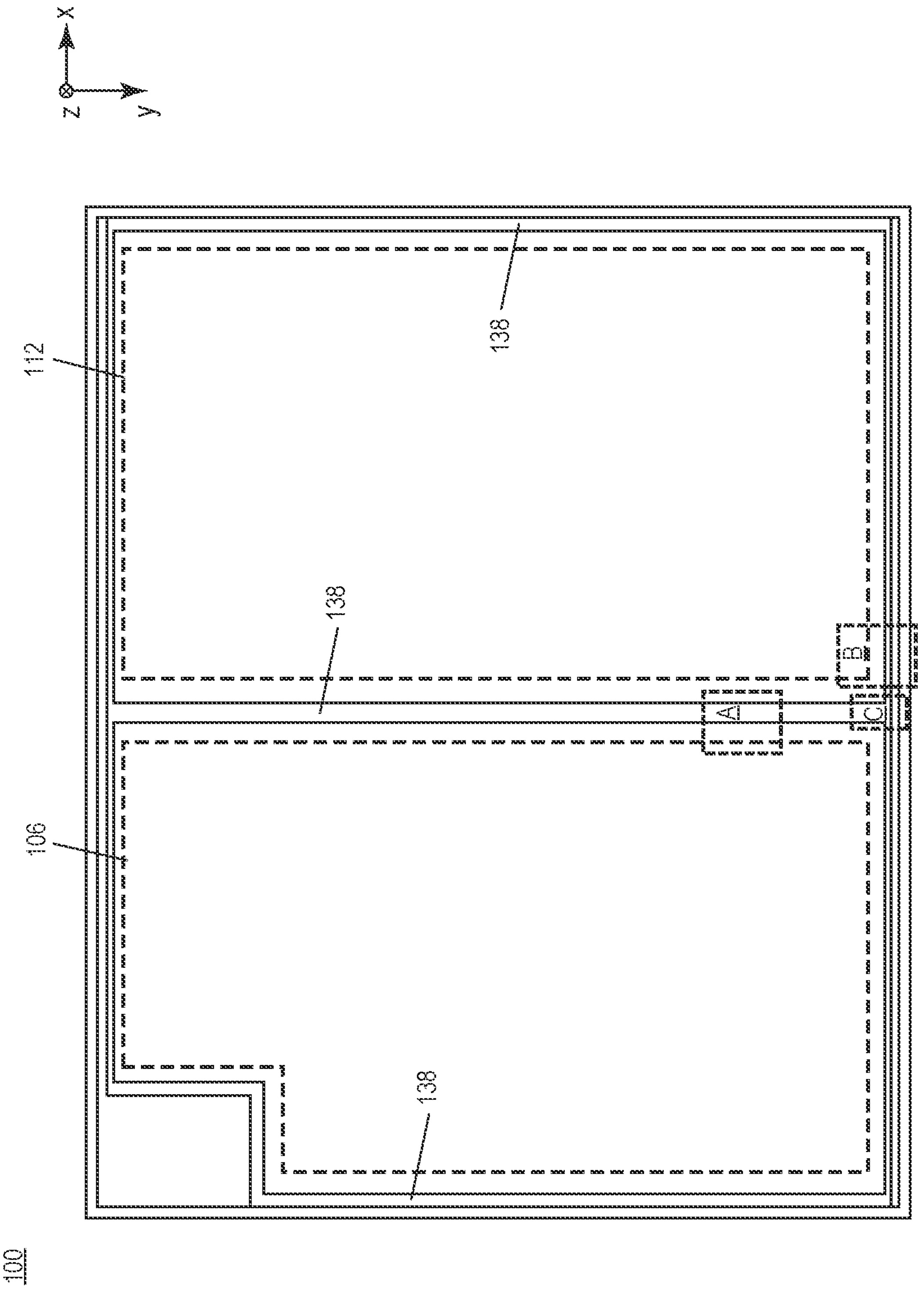
FIG. 1 illustrates a top plan view of a semiconductor die that includes a transistor device with a termination region.
Figure 2:
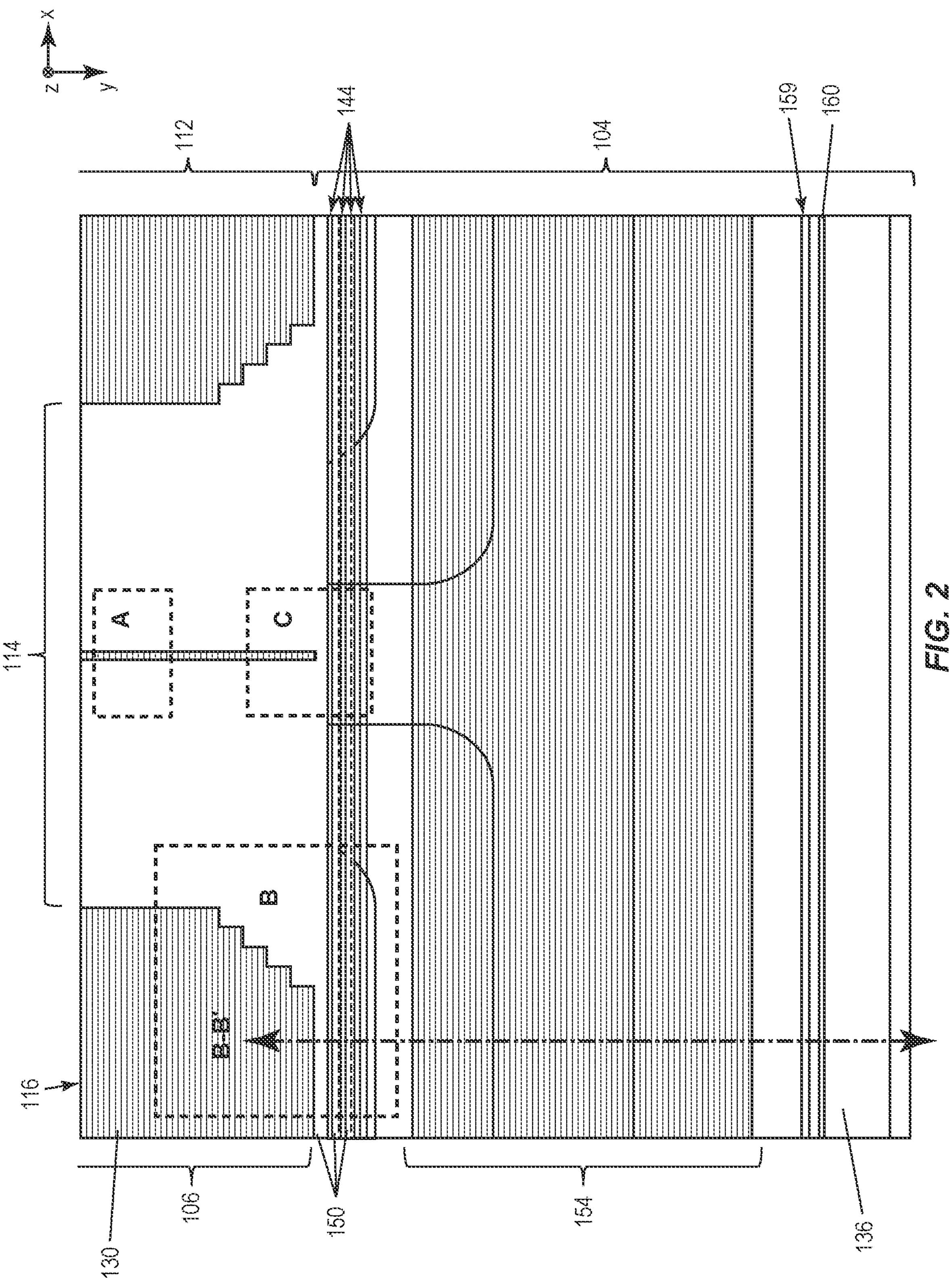
FIG. 2 illustrates an enlarged top plan view of part of the semiconductor die.
Figure 3:
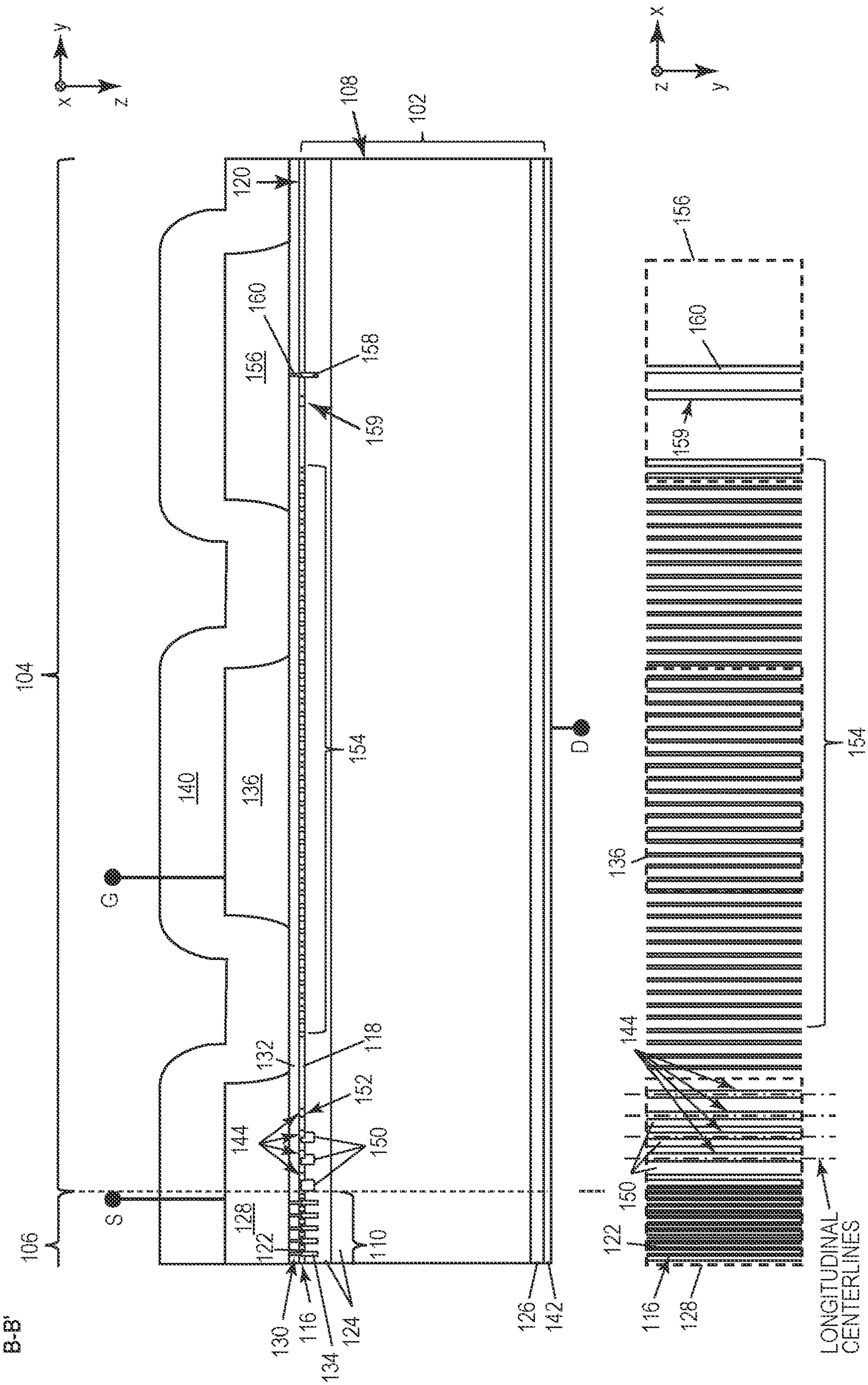
FIG. 3 illustrates a cross-sectional view of the semiconductor die along the line labelled B-B' in FIG. 2.
Figure 4:
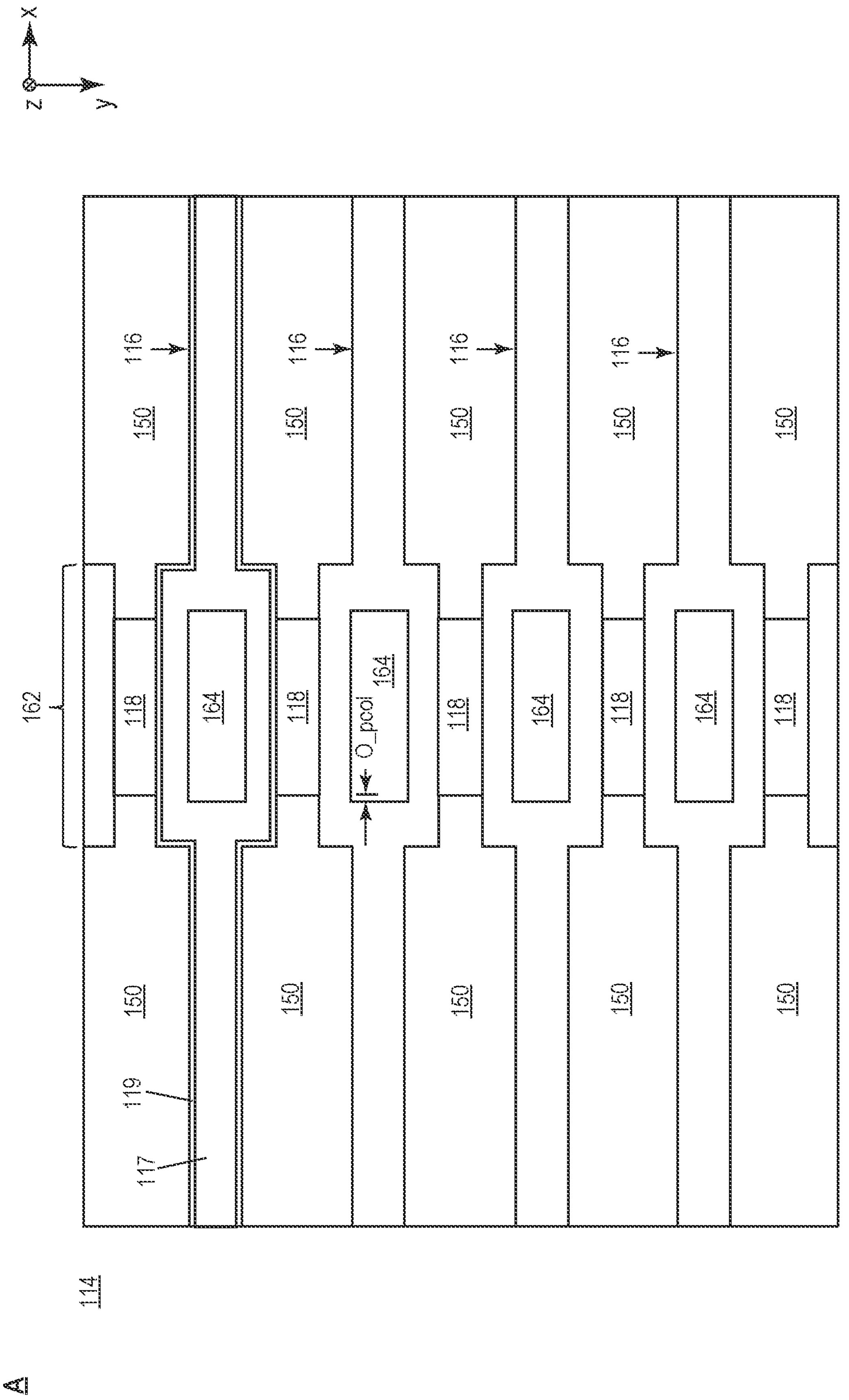
FIG. 4 illustrates an enlarged top plan view of the region of the semiconductor die labelled 'A' in FIG. 2.
Figure 5:
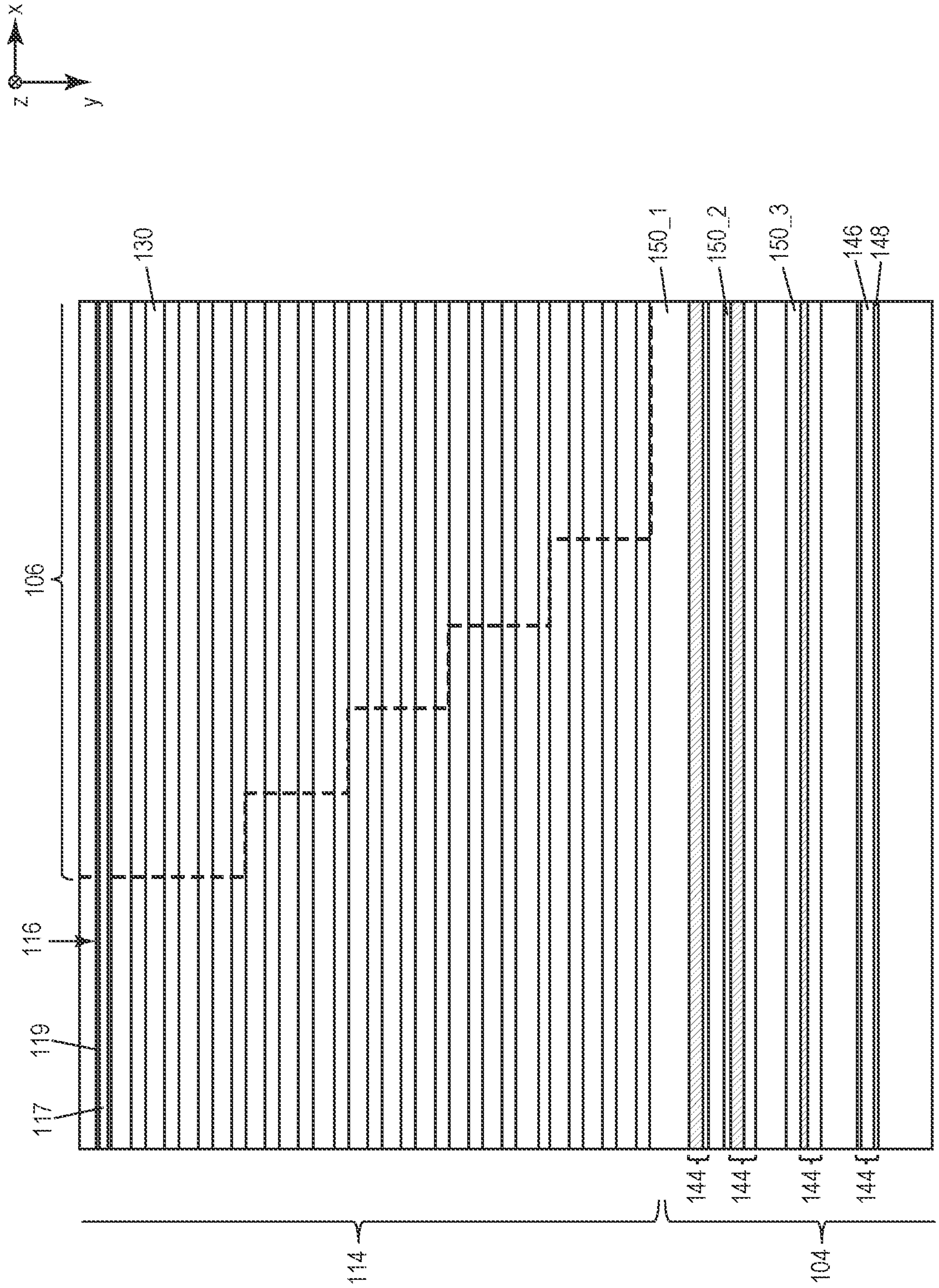
FIG. 5 illustrates an enlarged top plan view of the region of the semiconductor die labelled 'B' in FIG. 2.
Figure 6:
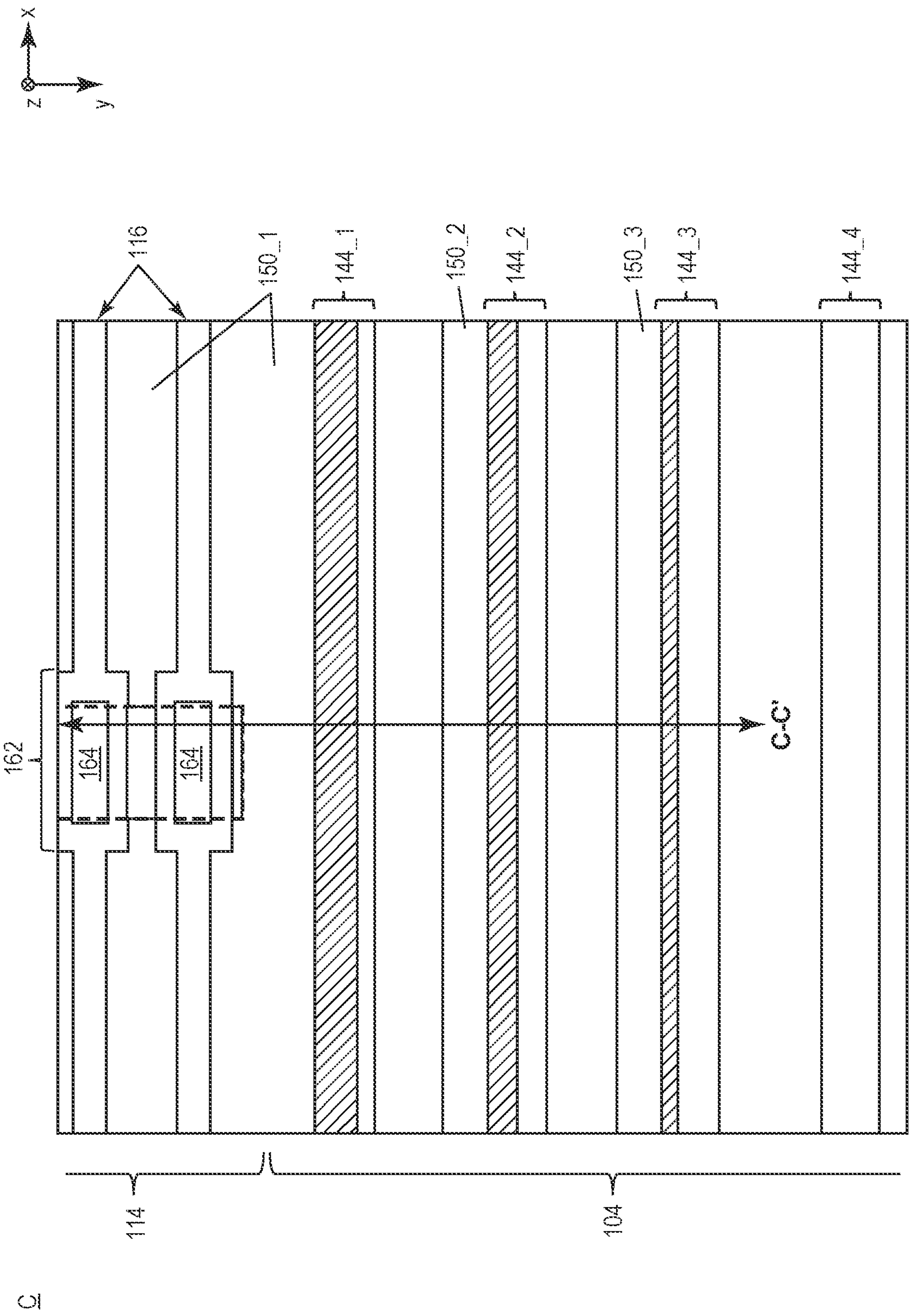
FIG. 6 illustrates an enlarged top plan view of the region of the semiconductor die labelled 'C' in FIG. 2.

FIG. 1 illustrates a top plan view of a semiconductor die 100 that includes a transistor device. FIG. 2 illustrates an enlarged top plan view of part of the semiconductor die 100. FIG. 3 illustrates a cross-sectional view of the semiconductor die 100 along the line labelled B-B' in FIG. 2. FIG. 4 illustrates an enlarged top plan view of the region of the semiconductor die 100 labelled 'A' in FIG. 2. FIG. 5 illustrates an enlarged top plan view of the region of the semiconductor die 100 labelled 'B' in FIG. 2. FIG. 6 illustrates an enlarged top plan view of the region of the semiconductor die 100 labelled 'C' in FIG. 2.

The transistor device includes a semiconductor substrate 102 having a termination region 104 interposed between a first active cell region 106 and an edge 108 of the semiconductor substrate 102. Transistor cells 110 are formed in the first active cell region 106 and electrically coupled in parallel to form a power transistor such as a vertical power MOSFET (metal-oxide-semiconductor field-effect transistor), where the transistor cells 110 have the same or similar construction. In general, the transistor device may have tens, hundreds, thousands, or even more transistors cells 110. The termination region 104 does not include fully functional transistor cells and therefore does not form part of the main current pathway of the transistor device. The termination region 104 instead is designed to support the breakdown voltage of the transistor device while also providing a lateral transition of a high electric potential (such as drain potential) near the edge 108 of the semiconductor substrate 102 to a low electric potential (such as source potential) in the first active cell region 106. The semiconductor substrate 102 may have a single active cell region 106 or two or more active cell regions 106, 112 separated by an inactive region 114 that is devoid of fully functional transistor cells.

The semiconductor substrate 102 in which the transistor cells 110 are formed comprises one or more semiconductor materials that are used to form a power semiconductor transistor such as, e.g., a Si or SiC power MOSFET. For example, the semiconductor substrate 102 may comprise Si, silicon carbide (SiC), germanium (Ge), silicon germanium (SiGe), gallium nitride (GaN), gallium arsenide (GaAs), and the like. The semiconductor substrate 102 may include one or more epitaxial layers.

The transistor cells 110 formed in the semiconductor substrate 102 include gate trenches 116 formed in a body region 118 of a first conductivity type (which may be p-type in some embodiments). The body region 118 is blanket implanted into the semiconductor substrate 102 and therefore extends into the termination region 104. The gate trenches 116 extend in a vertical direction (z direction in the figures) from a first main surface 120 of the semiconductor substrate 102 into the semiconductor substrate 102. The gate trenches 116 are illustrated as stripe-shape trenches in the figures. The term 'stripe-shape' as used herein means a structure having a longest linear dimension in a direction (y direction in the figures) generally perpendicular to the depth-wise direction (z direction in the figures) of the semiconductor substrate 102.

Each gate trench 116 includes a gate electrode 117 and at least one dielectric material 119 such as a single dielectric material or a material stack, e.g., thermal and/or deposited oxide that separates the gate electrode from the semiconductor substrate 102. The gate electrodes 117 and the gate dielectric 119 are not shown in the figures except for the topmost gate trench 116 in FIGS. 4 and 5, so as to not obfuscate the termination region features.

Each transistor cell 110 further includes a source region 122 of a second conductivity type opposite the first conductivity type (such as n-type when the first conductivity type is p-type). The source region 122 of each transistor cell 110 is separated from a (common) drift region 124 of the second conductivity type by the body region 118. In the case of a vertical power transistor, a drain region 126 of the second conductivity type is disposed at the backside of the semiconductor substrate 102.

The first conductivity is p-type and the second conductivity type is n-type for an n-channel device formed by the transistor cells 110, whereas the first conductivity is n-type and the second conductivity type is p-type for a p-channel device formed by the transistor cells 110. For either an n-channel device or a p-channel device, the source region 122 and part of the body region 118 each form part of a transistor cell 110 and the transistor cells 110 are electrically connected in parallel between source (S) and drain (D) terminals of the transistor device to form a power transistor.

The transistor cells 110 may include a body contact region of the first conductivity type, which is not visible in the figures. The body contact region has a higher doping concentration than the body region 118, to provide an ohmic connection with a source metallization 128 through a contact structure 130 such as electrically conductive vias that extends through an interlayer dielectric 132 that separates the source metallization 128 from the semiconductor substrate 102. The source regions 122 of the transistor cells 110 are also electrically connected to the source metallization 128 through the contact structure 130. The source metallization 128 is not shown in FIGS. 1, 2 and 4-6 to provide an unobstructed view of the underlying structures.

In one embodiment, the transistor device includes a superjunction structure that provides charge balance. Contacts 130 to the body region 118 and the source regions 122 of the transistor cells 110 are disposed in respective contact openings in the interlayer dielectric 132. Implanted regions 134 of the first conductivity type (i.e., the same conductivity type as the body region 118) are aligned with each contact opening and extend through the body region 118 into the drift region 124 of the transistor device, to form superjunction columns with the oppositely doped part of the semiconductor substrate 102 that includes the drift region 124.

The gate electrodes of the transistor device are electrically connected to a gate terminal (G) through a gate metallization 136 which may include one or more gate metal runners 138. Gate metal runners 138 may run along the perimeter of the semiconductor die 100 and/or along the middle of the semiconductor die 100, e.g., in the case of the semiconductor die 100 including more than one active cell region 106, 112. The gate metallization 136 may be part of a structured power metallization that also includes the source metallization 128. Such a structured power metallization may include a thick power metal layer that comprises Cu, Al, AlCu, AlSiCu, etc., a diffusion barrier and/or adhesion promoter such as Ti and/or TiN and/or W between the thick power metal layer and the interlayer dielectric. The structured power metallization may be covered by a passivation 140 such as polyimide, except where contacts to or pads for the gate metallization 136 and the source metallization 128 are provided. A drain metallization 142 may be provided at the opposite side of the semiconductor substrate 102 as the source metallization 128 of the transistor device.

The transistor device has a certain breakdown voltage, e.g., 30V, 40V, 50V, etc. The termination region 104 supports the breakdown voltage plus margin, e.g., 34V in total for a breakdown voltage of 30V. The termination region 104 also provides a lateral transition of a high electric potential (e.g., 34V) near the edge 108 of the semiconductor substrate 102 to a low electric potential (e.g., 0V) in each active cell region 106, 112. To provide the lateral high-to-low electrical potential transition, the termination region 104 includes at least one termination (cut-off) trench 144 that laterally surrounds the active cell region(s) 106, 112 and extends through the body region 118 so that the body region 118 is interrupted in the termination region 104 by the termination trench 144.

Each termination trench 144 may include an electrically conductive material 146 such as polysilicon and/or a metal that is separated from the semiconductor substrate 102 by an electrically insulative material 148, e.g., as shown in FIG. 5 for the outermost one of the isolation trenches as an example. In one embodiment, the electrically conductive material 146 in each termination trench 144 is electrically floating. The electrically conductive material 146 in at least the innermost termination trench 144 instead may be connected to source (S) potential. The termination trenches 144 may have a ring-like shape in a top down plan view, for example.

In FIGS. 1 through 6, the termination region 104 is shown with four (4) termination trenches 144. This is just an example. The termination region 104 may have more or fewer termination trenches 144 than what is shown in FIGS. 1 through 6. For example, the termination region 104 may have a single termination trench 144, two (2) termination trenches 144, etc.

The termination region 104 also includes a doped potential drop region 150 of the first conductivity type (i.e., same conductivity type as the body region 118) that follows at least one termination trench 144 and adjoins part of the bottom 152 of the termination trench 144. Each doped potential drop region 150 terminates deeper in the semiconductor substrate 102 than the body region 118 and is off-center to a longitudinal centerline of the termination trench 144 that the doped region 150 follows. The longitudinal centerline of each termination trench 144 is indicated by a dash-dotted line in the lower half of FIG. 3, which is a partial top plan view that corresponds to the cross-sectional view provided in the upper part of FIG. 3. Each longitudinal centerline indicates an axis of symmetry along the lengthwise extension (y direction in the figures) of the corresponding termination trench 144.

The termination region 104 also may include additional trenches 154 between the termination trenches 144 and the edge 108 of the semiconductor substrate 102. These additional trenches may include an electrically conductive material (not shown) that is separated from the semiconductor substrate 102 by an electrically insulative material (not shown), and may be electrically floating or at a defined electric potential such as source potential.

The structured power metallization may include an additional metal line 156 between the gate metallization 136 and the edge 108 of the semiconductor substrate 102. In FIG. 3, the additional metal line 156 is connected to an outer ring 158 of the first conductivity type (i.e., the same conductivity type as the body region 118) formed closest to the edge 108 of the semiconductor substrate 102, through one or more contacts 160 that extend through the interlayer dielectric 132. This outer peripheral region of the semiconductor die 100 may also include a trench 159 that is connected to the additional metal line 156 and, through the contacts 160, ensures the die edge is at drain potential, e.g., compared to the trenches 154 which may be floating.

As shown in FIGS. 1 through 6, each doped potential drop region 150 of the first conductivity type is off-center to the longitudinal centerline of the adjoining termination trench 144. Accordingly, in a top down view, each doped potential drop region 150 covers more of the trench bottom 152 on one side of the trench longitudinal centerline than on the other side. In some examples, the doped potential drop region 150 may not cover any part of the trench bottom 152 on one side of the trench longitudinal centerline. In other examples, the doped potential drop region 150 may straddle the trench longitudinal centerline but cover more of the trench bottom 152 on one side of the trench longitudinal centerline than on the other side. In some embodiments, the doped potential drop region 150 may span from an outermost position underneath the trench bottom (such as where the trench bottom meets a first sidewall of the trench) to a position underneath the trench bottom that does not reach to the opposing outermost position underneath the trench bottom (such as where the trench bottom meets a second sidewall of the trench). Ensuring that each doped potential drop region 150 partly but not completely overlaps the bottom 152 of the adjoining termination trench 144 yields breakdown improvement while shielding the covered bottom corner of the termination trench 144 from a high electric field. The amount of overlap between each doped potential drop region 150 and the bottom 152 of the adjoining termination trench 144 is indicated by corresponding diagonal lines in FIGS. 5 through 7.

As shown in FIG. 3, not all of the termination trenches 144 have a doped potential drop region 150 of the first conductivity type that follows the termination trench 144 and that terminates deeper in the semiconductor substrate 102 than the body region 118. In FIG. 3, the bottom 152 of the outermost (rightmost) termination trench 144 is adjoined by no such doped potential drop region 150. However, this is just an example. More generally, the termination region 104 has at least one termination (cut-off) trench 144 with a doped potential drop region 150 of the first conductivity type that follows the termination trench, adjoins part of the bottom 152 of the termination trench 144, terminates deeper in the semiconductor substrate 102 than the body region 118, and is off-center to the trench longitudinal centerline.

Figure 7:
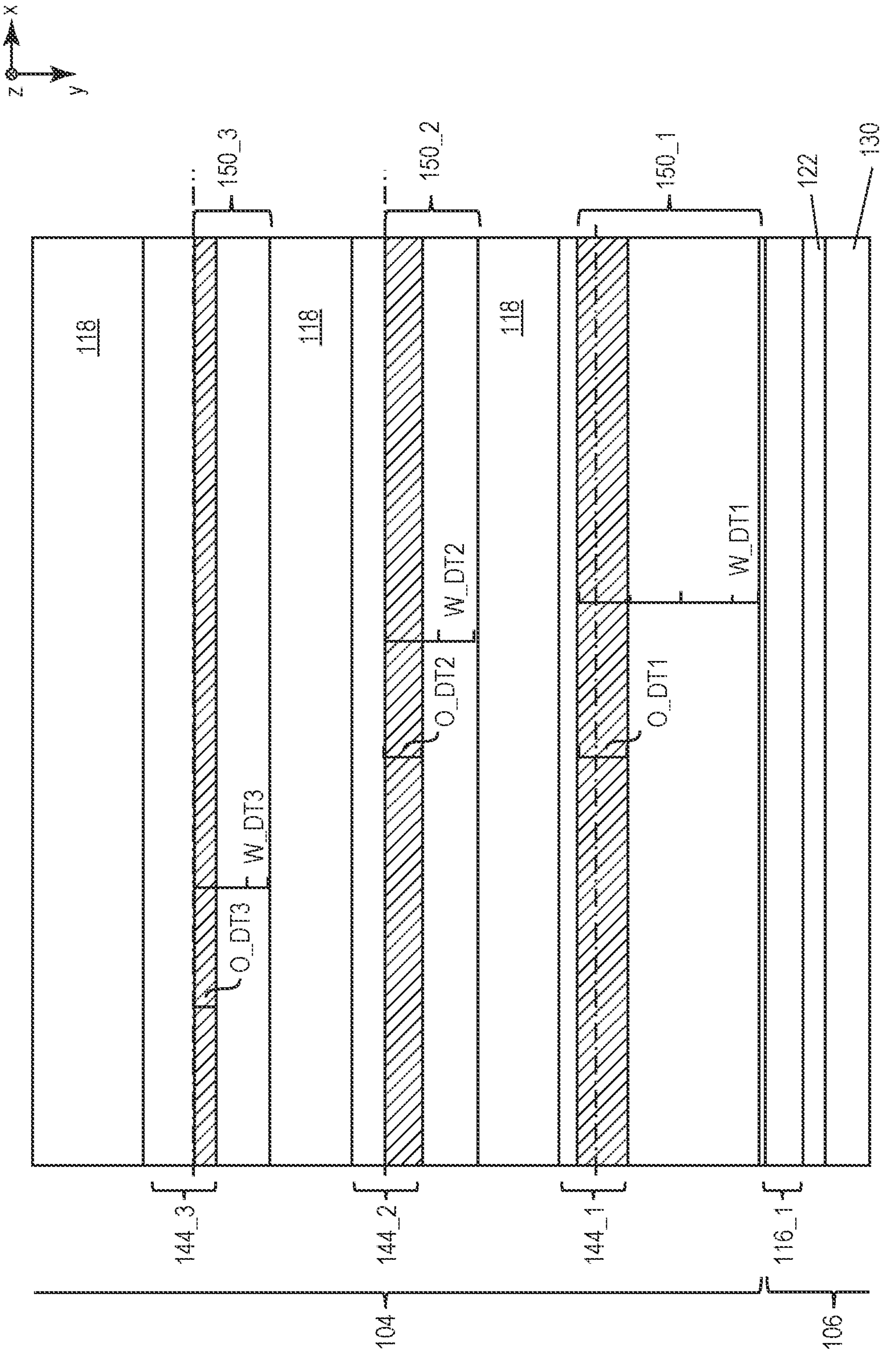
FIG. 7 illustrates a top plan view of part of three innermost termination trenches of the termination region and an outermost gate trench and source contact of an active cell region of the transistor device.

FIG. 7 illustrates a top plan view of part of the three innermost termination trenches 144_1, 144_2, 144_3 of the termination region 104 and the outermost gate trench 116_1 and source contact 130 of the first active cell region 106. As shown in FIG. 7, the doped potential drop region 150_1 that follows the innermost termination trench 144_1 covers a first percentage O_DT1 of the bottom 152 of the innermost termination trench 144_1 along the length of the termination trench 144_1. In one embodiment, the first percentage is greater than 50%, e.g., 75% (e.g., 75%+/−5%). According to this embodiment, the innermost doped potential drop region 150_1 straddles the longitudinal centerline of the innermost termination trench 144_1 but still covers more (100% in this example) of the trench bottom 152 on the side of the longitudinal centerline that is closer to the first active cell region 106 and covers less (about 25% in the illustrated example) of the trench bottom 152 on the other side of the longitudinal centerline and therefore is off-center to the longitudinal centerline.

The doped potential drop region 150_2 that follows the second innermost termination trench 144_2 covers a second percentage O_DT2 of the bottom 152 of the second innermost termination trench 144_2 along the length of the termination trench 144_2 in FIG. 7. In one embodiment, the second percentage is about 50% (e.g., 50%+/−5%). According to this embodiment, the second innermost doped potential drop region 150_2 covers almost all or even 100% of the trench bottom 152 on the side of the longitudinal centerline of the second innermost termination trench 144_2 that is closer to the first active cell region 106 and covers almost none or even 0% of the trench bottom 152 on the other side of the longitudinal centerline and therefore is off-center to the longitudinal centerline.

The doped potential drop region 150_3 that follows the third innermost termination trench 144_3 covers a third percentage O_DT3 of the bottom 152 of the third innermost termination trench 144_3 along the length of the termination trench 144_3 in FIG. 7. In one embodiment, the third percentage is less than 50%, e.g., about 25% (e.g., 25%+/−5%). According to this embodiment, the third innermost doped potential drop region 150_3 covers less than 100% of the trench bottom 152 on the side of the longitudinal centerline of the third innermost termination trench 144_3 that is closer to the first active cell region 106 and covers 0% on the other side of the longitudinal centerline and therefore is off-center to the longitudinal centerline.

In one embodiment, the first percentage O_DT1 is greater than the second percentage O_DT2 such that the innermost doped potential drop region 150_1 covers more of the bottom 152 of the innermost termination trench 144_1 compared to the second innermost doped potential drop region 150_2 which covers less of the bottom 152 of the second innermost termination trench 144_2. The second percentage O_DT2 may be greater than the third percentage O_DT3 such that the second innermost doped potential drop region 150_2 covers more of the bottom 152 of the second innermost termination trench 1442 compared to the third innermost doped potential drop region 150_3 which covers less of the bottom 152 of the third innermost termination trench 144_3. The bottom 152 of the termination trenches 144 are out of view in FIG. 7.

In absolute terms, the innermost doped potential drop region 150_1 may cover 0.4 μm to 0.5 μm of the bottom 152 of the innermost termination trench 144_1 along a length of the innermost termination trench 144_1, the second innermost doped potential drop region 150_2 may cover 0.25μ to 0.35 μm of the bottom 152 of the second innermost termination trench 144_2 along a length of the second innermost termination trench 144_2, and the third innermost doped potential drop region 1503 may cover 0.1 μm to 0.2 μm of the bottom 152 of the third innermost termination trench 144_3 along a length of the third innermost termination trench 144_3.

In another embodiment, the amount of overlap at the bottom 152 of the termination trenches 144 may be the same or decrease moving in a direction from the first active cell region 106 toward the edge 106 of the semiconductor substrate 102. That is, in FIG. 7, O_DT1 may be less than or equal to O_DT1 and O_DT2 may be less than or equal to O_DT3. Any of the doped potential drop regions 150 that run along a termination trench 144 and extend deeper into the semiconductor substrate 102 than the body region 118 cover less than 100% and more than 0% of the bottom 152 of the corresponding termination trench 144 along a length of the termination trench 144.

Any of the doped potential drop regions 150 that run along a termination trench 144 may extend vertically (z direction in the figures) along part of a single sidewall of the adjoining termination trench 144. For example, in FIG. 3, the doped potential drop regions 150 that run along the three innermost termination trenches 144 extend vertically along part of the left sidewall of the corresponding termination trench 144. None of the doped potential drop regions 150 extend to the opposite sidewall of the same termination trench 144 or to the adjacent doped potential drop region 150.

If any doped potential drop region 150 instead were to overlap the entire bottom 152 of the corresponding termination trench 144, the full electric potential will transfer to the next termination trench 144 and there would be no potential drop. If any doped potential drop region 150 terminates before reaching the corresponding termination trench 144, a high electric field would be present at the trench bottom corner. Ensuring that each doped potential drop region 150 partly but not completely overlaps the bottom 152 of the adjoining termination trench 144 yields breakdown improvement while shielding the covered bottom corner of the termination trench 144 from a high electric field.

Figure 8:
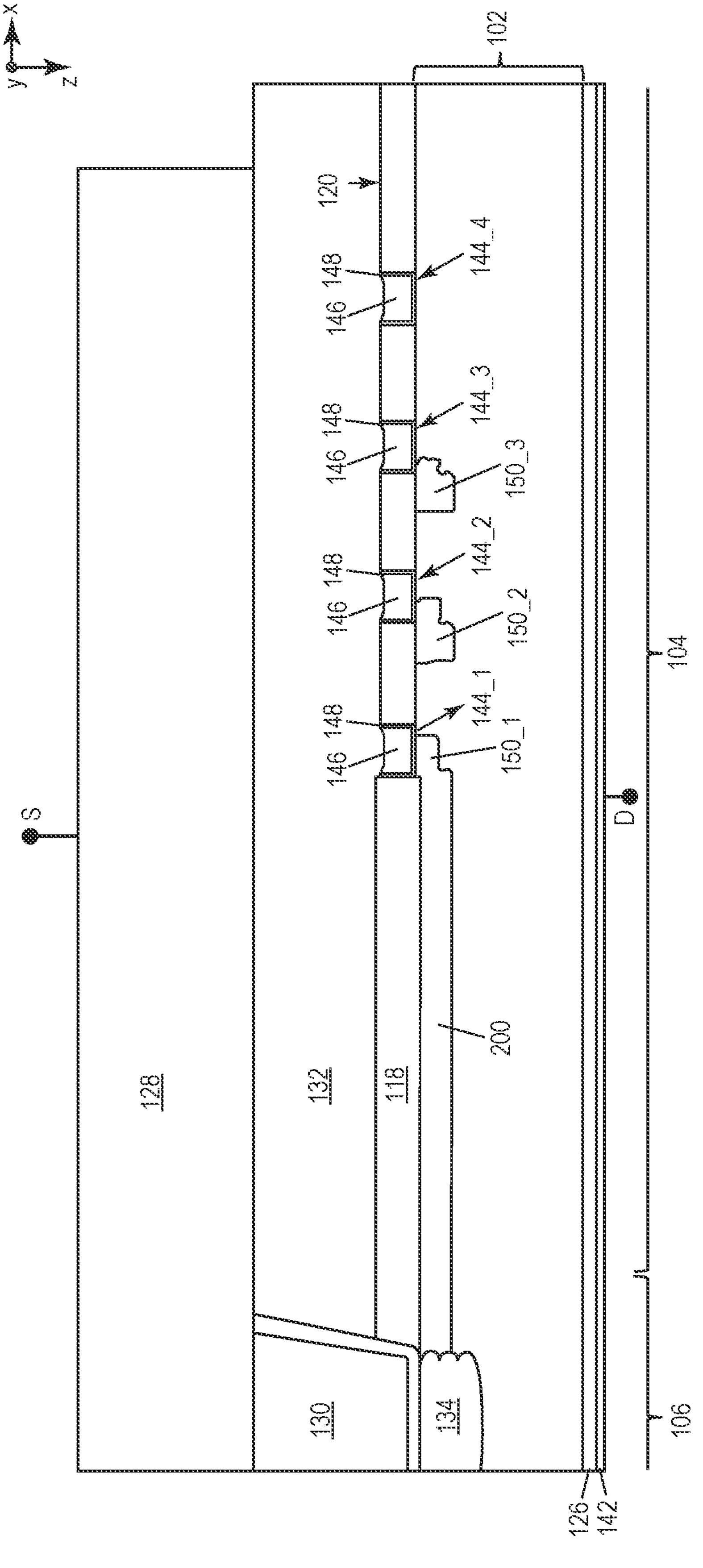
FIG. 8 illustrates the same cross-sectional view as FIG. 3, in the region of the semiconductor die where the termination region adjoins an active cell region.

FIG. 8 illustrates the same cross-sectional view as FIG. 3, in the region of the semiconductor die 100 where the termination region 104 adjoins the first active cell region 106. According to this embodiment, the doped potential drop region 150_1 that follows the innermost termination trench 144_1 is connected to source (S) potential, e.g., via the body region 118, a lateral extension 200 of the innermost doped potential drop region 150_1 below the body region 118, and an outermost superjunction column 134 of the first conductivity type in the first active cell region 106 that is connected to the source metallization 128 through a corresponding contact 130. The doped potential drop region 150_2 that follows the second innermost termination trench 144_2 and the doped potential drop region 150_3 that follows the third innermost termination trench 144_3 may be electrically floating, e.g., as shown in FIG. 8.

As shown in FIGS. 2, 4, 5, and 6, the semiconductor substrate 102 may further include a second active cell region 112 that shares the gate trenches 116 of the transistor cells 110 with the first active cell region 106. According to this embodiment, the termination region 104 is interposed between the second active cell region 112 and the edge 108 of the semiconductor substrate 102. As shown in FIGS. 1 and 2, this means that the termination trenches 144 of the termination region 104 laterally encircle the first active cell region 106 and the second active cell region 112 (and any other active cell regions) formed in the semiconductor substrate 102 and within the perimeter delimited by the termination region 104.

As shown in FIG. 1, a gate metal runner 138 may be disposed on the interlayer dielectric 132 above the inactive region 114 of the semiconductor substrate 102 that separates the first active cell region 106 and the second active cell region 112 from one another. The inactive region 114 is devoid of fully functional transistor cells and therefore does not form part of the main current pathway of the transistor device.

The gate trenches 116 extend from the first active cell region 106 into the second active cell region 112 through the inactive region 114. The gate metal runner 138 is connected to an electrically conductive material 117 such as polysilicon and/or a metal in the gate trenches 116, through respective contact openings in the interlayer dielectric 132. The gate trenches 116 have a part or section 162 in the inactive region 114 where the gate metal runner 138 is connected to the electrically conductive material 117 in the gate trenches 116, e.g., as shown in FIG. 4. As shown in FIG. 4, the part 162 of the gate trenches 116 in the inactive region 114 where the connection to the gate metal runner 138 is made may be wider than the part of the gate trenches 116 in the active cell regions 106, 112, e.g., to facilitate the gate metal runner connection. However, this is just an example. If smaller gate metal runner contacts are available, the gate trenches 116 do not have to be widened in the inactive region 114 to facilitate the gate metal runner connections.

An implanted region 164 of the first conductivity type (i.e., of the body region conductivity type 118) is formed in the inactive region 114 below the part of the gate trenches 116 where the gate metal runner 138 is connected to the electrically conductive material 117 in the gate trenches 116. The implanted region 164 of the first conductivity type may be formed as part of a superjunction implantation process used to form the implanted regions 134 of the first conductivity type that are aligned with the source/body contact openings in the active cell regions 106, 112, e.g., as described later herein.

As shown in FIGS. 2 and 6, the innermost termination trench 144_1 of the termination region 104 adjoins the first active cell region 106, the second active cell region 112, and the inactive cell region 114. According to this embodiment, the doped potential drop region 150_1 that follows the innermost termination trench 140_1 extends into the inactive region 114 and either partly but not completely overlaps the implanted region 164 of the first conductivity type formed below the part 162 of the gate trenches 116 where the gate metal runner connections are provided or does not overlap the implanted region 164 at all. A dashed line is used in FIGS. 5 and 6 to indicate the boundary between where the innermost doped potential drop region 150_1 is present in the inactive region 114 and not present in either active cell region 106, 112.

FIGS. 2, 4, 5, and 6 illustrate the mask layout for the implantation process used to form the doped potential drop regions 150 of the termination region 114. The solid part in FIG. 2 indicates where the implant to form the doped potential drop regions 150 enters the semiconductor substrate 102. The open part in FIG. 2, which shows the source contacts 130, indicates where the potential drop region implant is blocked from entering the semiconductor substrate 102.

As indicated by the regions labelled 'A' and 'C' in FIGS. 2, 4, and 6, the potential drop region implant may be blocked along most or all of the part of the semiconductor die 100 where the gate contact implants are performed in the inactive region 114. By mostly or completely blocking the potential drop region implant in this part of the semiconductor die 100, the doping concentration of the first conductivity type (i.e., the same conductivity type as the body region 118) does not become excessively high under the gate contacts which avoids a potential breakdown weak point.

In FIG. 4, the overlap between the potential drop region implant and the implant that forms the region 164 of the first conductivity type below the area of the gate trench contacts is indicated by O_pcol. In one embodiment, O_pcol is ≤10%. In absolute terms, O_pcol may be about 0.05 μm, as an example.

As shown in FIGS. 2 and 5, the first active cell region 106 and the second active cell region 112 may both have a stepwise profile along a border with the inactive cell region 114. According to this embodiment, the innermost termination trench 114_1 of the termination region 104 adjoins the first active cell region 106, the second active cell region 112, and the inactive cell region 114. The doped potential drop region 150_1 that follows the innermost termination trench 144_1 extends into the inactive region 114 and follows the stepwise profile of the first active cell region 106 and the second active cell region 112. For example, the inactive region 114 may be rendered inactive by omitting the source contact (and possibly also the source implant) from this part of the semiconductor substrate 102. In this example, the doped potential drop region 150_1 that follows the innermost termination trench 144_1 may also follow the stepwise source contact profile of the active cell regions 106, 112 of the transistor device.

Described next are embodiments of producing the transistor device with the termination region. FIGS. 9A through 9D illustrate cross-sectional views of the semiconductor die 100 during different stages of the manufacturing process in a part of the die 100 that corresponds to the line labelled B-B' in FIGS. 2 and 3, for the two outermost gate trenches 116_1, 116_2 of the first active cell region 106 and the innermost termination trench 144_1 of the termination region 104.

Figure 9A:
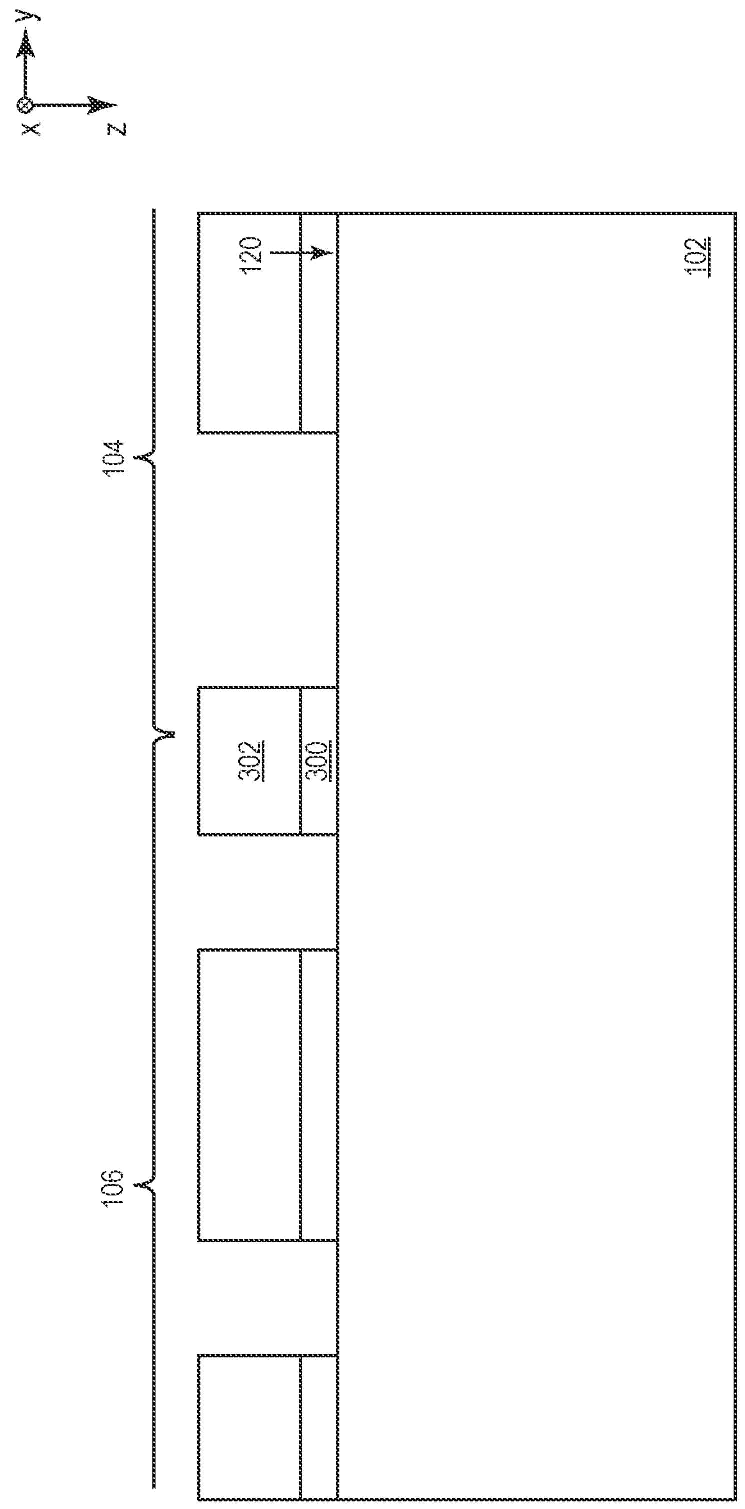
FIGS. 9A through 9D illustrate cross-sectional views of the semiconductor die during different stages of the manufacturing process in a part of the die that corresponds to the line labelled B-B' in FIGS. 2 and 3, for two outermost gate trenches of an active cell region and an innermost termination trench of the termination region.

FIG. 9A shows a hard mask 300 such as an oxide layer formed on the first main surface 120 of the semiconductor substrate 102 and a photomask 302 formed on the hard mask 300. The photomask 302 is used to photolithographically pattern the hard mask 300 to define trench locations in the semiconductor substrate 102.

Figure 9B:
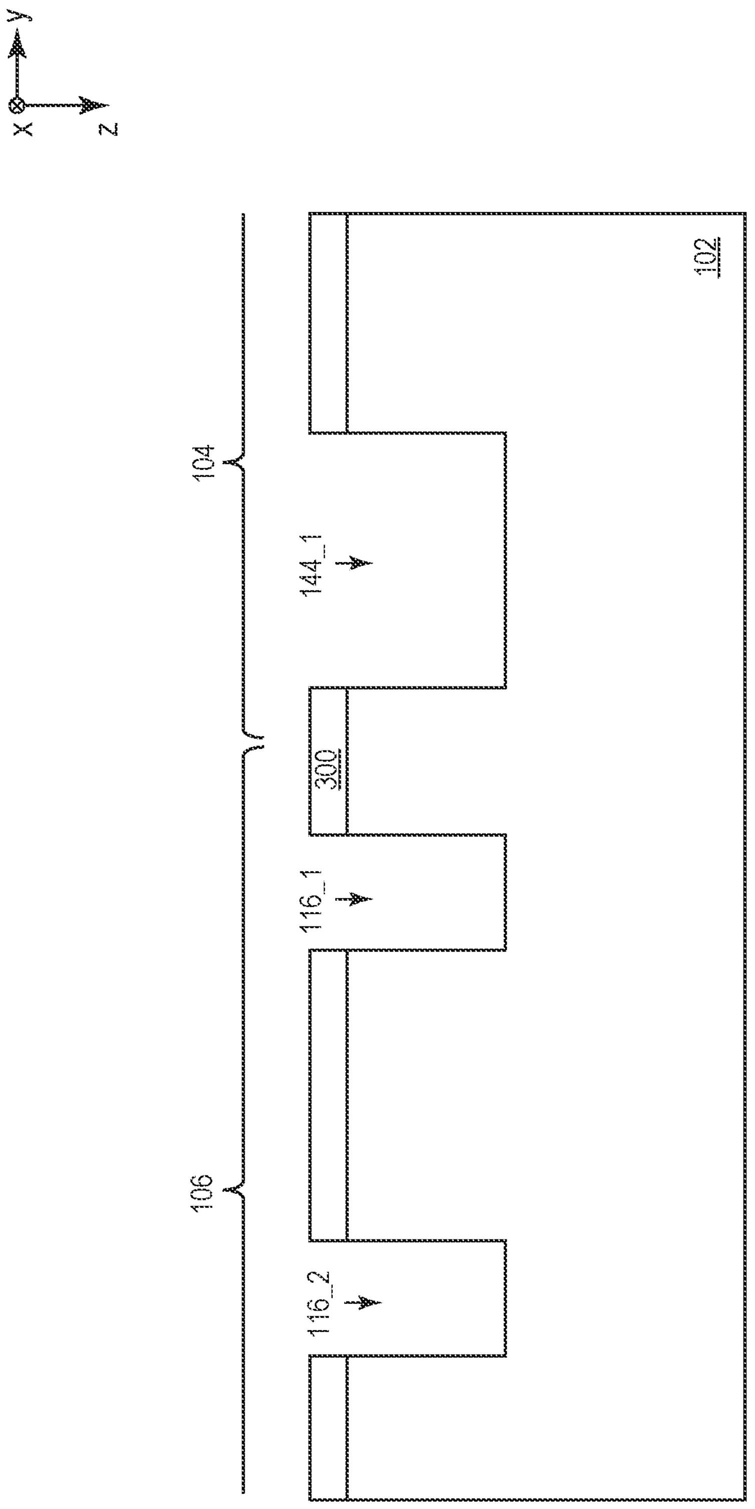

FIG. 9B shows the gate trenches 116 and the termination trenches 144 etched into the first main surface 120 of the semiconductor substrate 102 using through the corresponding openings in the hard mask 300, using a common trench etch process. As explained above, only the innermost termination trench 144_1 and the two outermost gate trenches 116_1, 116_2 are illustrated for ease of illustration. The active cell region 106 may include any reasonable number of gate trenches 116 and the termination region 104 may include any reasonable number of termination trenches 144.

In FIG. 9B, the innermost termination trench 144_1 is shown wider in the y direction than the two outermost gate trenches 116_1, 116_2 and with a closer spacing between the innermost termination trench 144_1 and the outermost gate trench 116_1 as compared to the spacing between the two outermost gate trenches 116_1, 116_2. This is just an example trench configuration and FIGS. 9A through 9D are not to scale. Accordingly, the innermost termination trench 144_1 may have the same width as the two outermost gate trenches 116_1, 116_2 but could also be wider such as 1.5 times or 2 times the width of the two outermost gate trenches 116_1, 116_2. For example, the termination trenches 144 may have a width of 0.6 μm and the gate trenches 116 may have a width in a range between 0.55 μm and 0.65 μm. The spacing between the innermost termination trench 144_1 and the outermost gate trench 116_1 may be different from the spacing shown in FIG. 9B. For example, the same or larger spacings may be provided between the innermost termination trench 144_1 and the outermost gate trench 116_1.

Figure 9C:
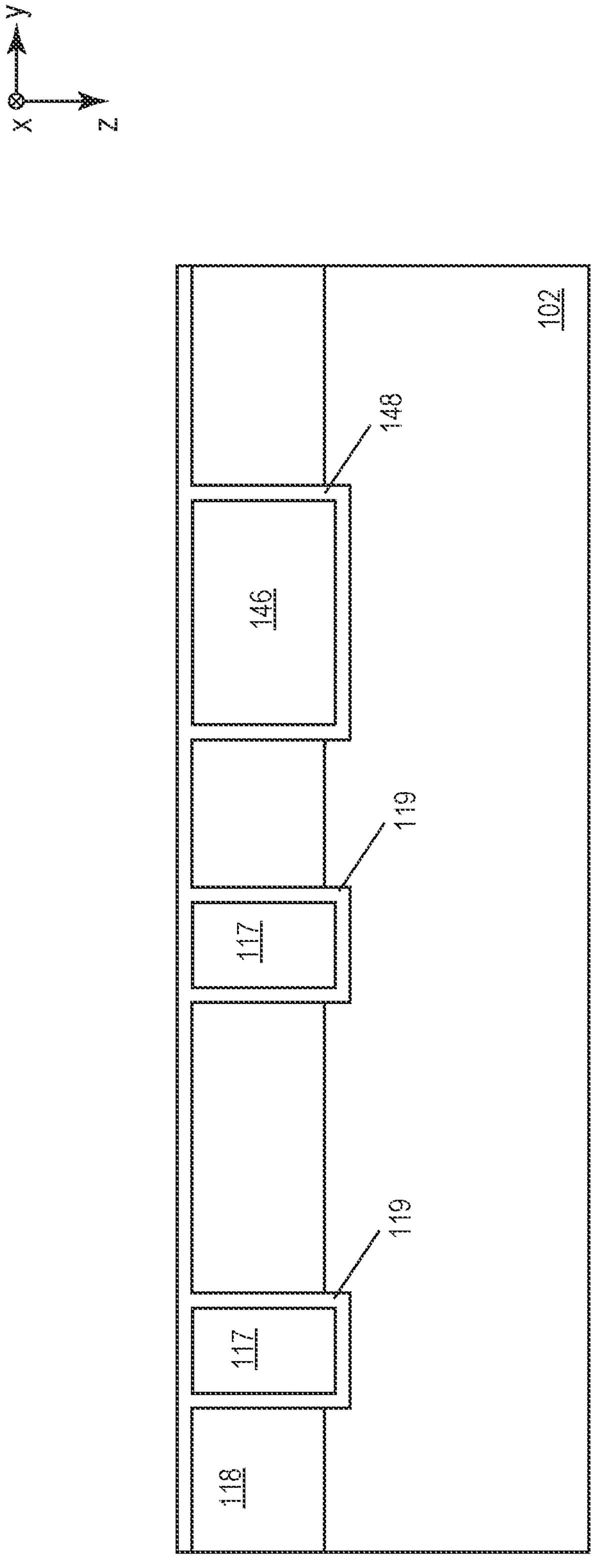

FIG. 9C shows the body region 118 blanket implanted into the first main surface 120 of the semiconductor substrate 102, such that the body region 118 is present in both the active cell region 106 and the termination region 104. The body region 118 is blanket implanted in that no mask is used to restrict the implantation of the body region dopant species into the semiconductor substrate 102. The electrically conductive material 146 and corresponding dielectric 148 in the gate trenches 116 and the electrically conductive material 117 and corresponding dielectric 119 in the termination trenches 144 may be formed using a common gate formation process.

Figure 9D:
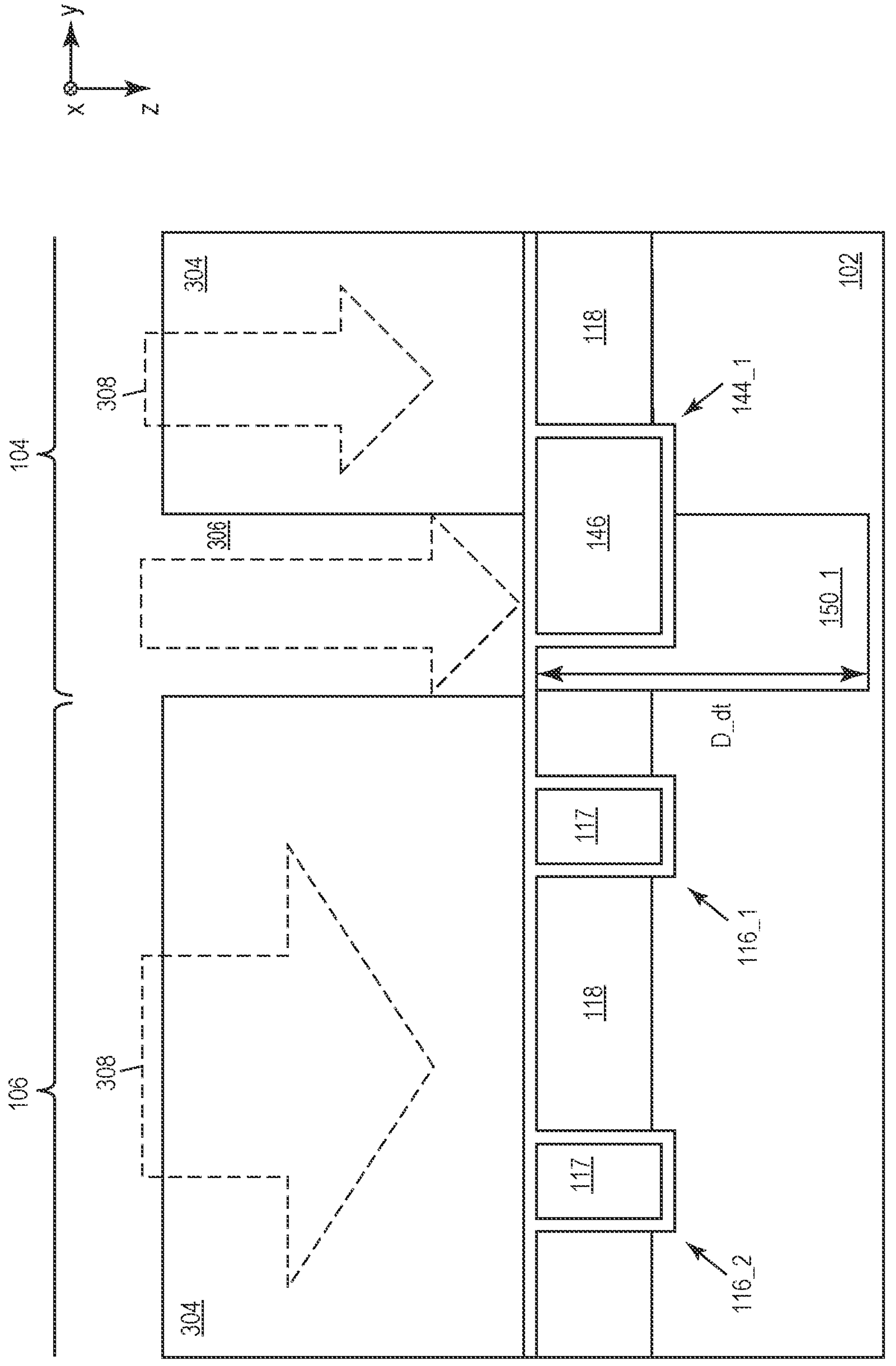

FIG. 9D shows the semiconductor substrate 102 during an implantation process that forms the doped potential drop regions 150 of the first conductivity type (i.e., same conductivity type as the body region 118) in the termination region 104. The implantation process includes forming a mask 304 such as a photomask on the semiconductor substrate 102 and that covers the first active cell region 106. The mask 304 has an opening 306 that partly overlaps one side of one or more of the termination trenches 144 previously formed in the termination region 104.

A dopant species 308 of the first conductivity type is then implanted into the semiconductor substrate 102 through each opening 306 in the mask 304. The dopant species 308 of the first conductivity type is implanted into the semiconductor substrate 102 prior to forming the interlayer dielectric 132 in FIG. 9D.

Since the mask opening 306 partly overlaps one side of the termination trench 144_1, this side of the termination trench structure is shielded from the dopant implant. Accordingly, the resulting doped potential drop region 150_1 is off-center to the longitudinal centerline of the termination trench 144_1. The amount of mask opening overlap determines how off-center the doped potential drop region 150_1 is to the longitudinal centerline of the termination trench 144_1, e.g., as illustrated in FIG. 7 where each O_DTn is determined by the amount of mask opening overlap with the corresponding termination trench 144.

The thickness of the mask 304 is chosen to block the dopant species 308 from entering the active cell region 106 of the semiconductor die 100, and depends on the type of dopant species 308, the implant energy, and the implant dose. For a silicon semiconductor substrate 102 and an n-channel transistor device, the dopant species 308 may be boron, for example. The concentration of each doped potential drop region 150 formed in the termination region 104 depends on the implant dose. The depth 'D_dt' of each doped potential drop region 150 formed in the termination region 104 depends on the implant energy and subsequent anneal parameters, which are chosen so that each doped potential drop region 150 terminates deeper in the semiconductor substrate 102 than the body region 118.

FIGS. 10A through 10F illustrate cross-sectional views of the semiconductor die 100 along the line labelled C-C' in FIG. 6, during different stages of the manufacturing process. FIGS. 10A through 10D correspond to the same process steps illustrated in FIGS. 9A through 9D, just in a different part of the semiconductor die 100.

Figure 10A:
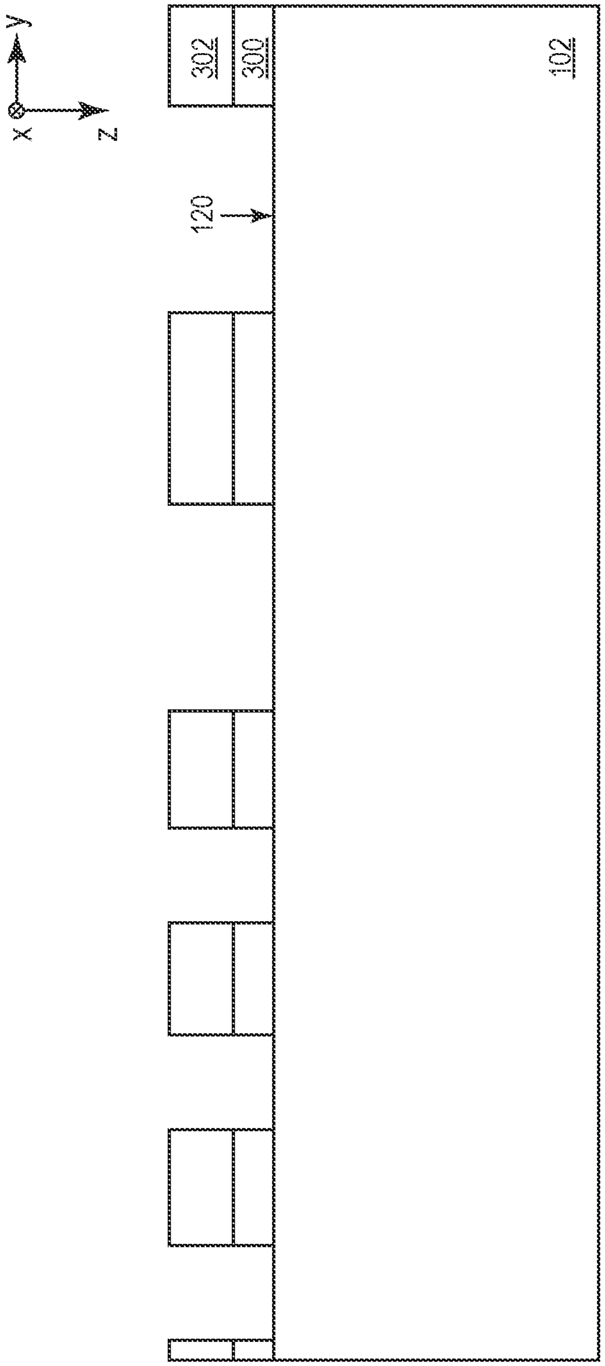
FIGS. 10A through 10F illustrate cross-sectional views of the semiconductor die along the line labelled C-C' in FIG. 6, during different stages of the manufacturing process.

FIG. 10A shows the hard mask 300 formed on the first main surface 120 of the semiconductor substrate 102 and the photomask 302 formed on the hard mask 300. The photomask 302 is used to photolithographically pattern the hard mask 300 to define trench locations in the semiconductor substrate 102, including the gate connection part 162 of the gate trenches 116 in the inactive region 114.

Figure 10B:
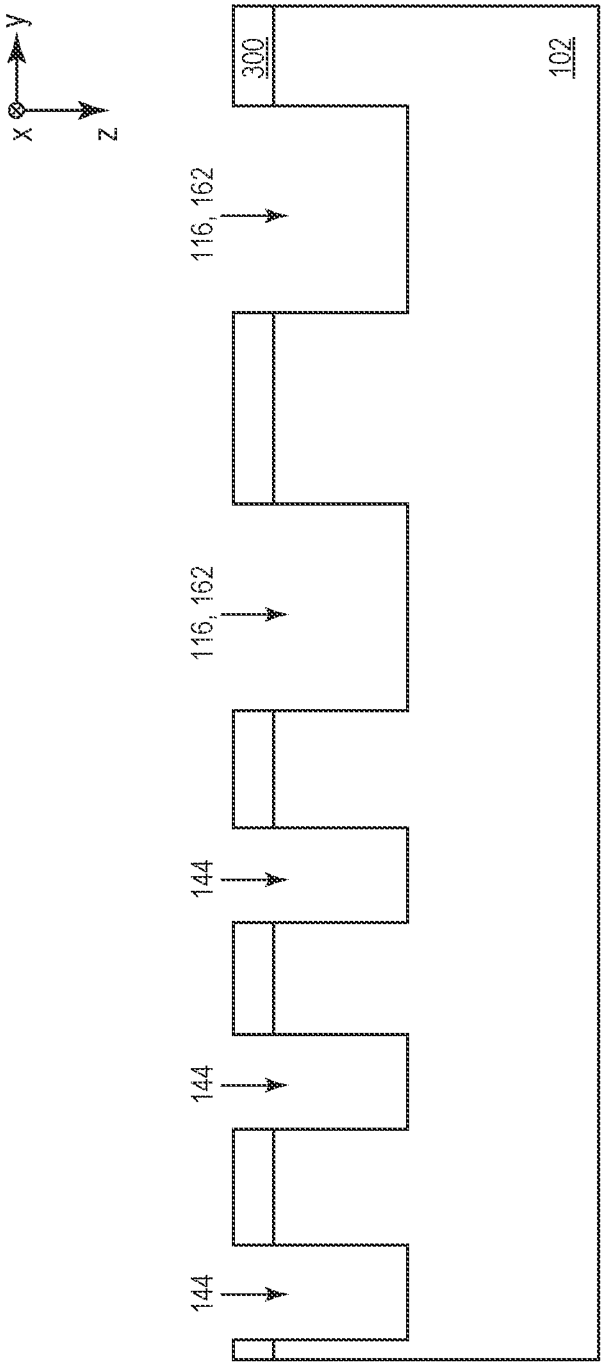

FIG. 10B shows the gate trenches 116, including the gate connection part 162 of the gate trenches 116 in the inactive region 114, etched into the first main surface 120 of the semiconductor substrate 102 using through the corresponding openings in the hard mask 300. As explained above in connection with FIG. 9B, a common trench etch process may be used to etch the gate trenches 116 and the termination trenches 144 into the semiconductor substrate 102.

Figure 10C:
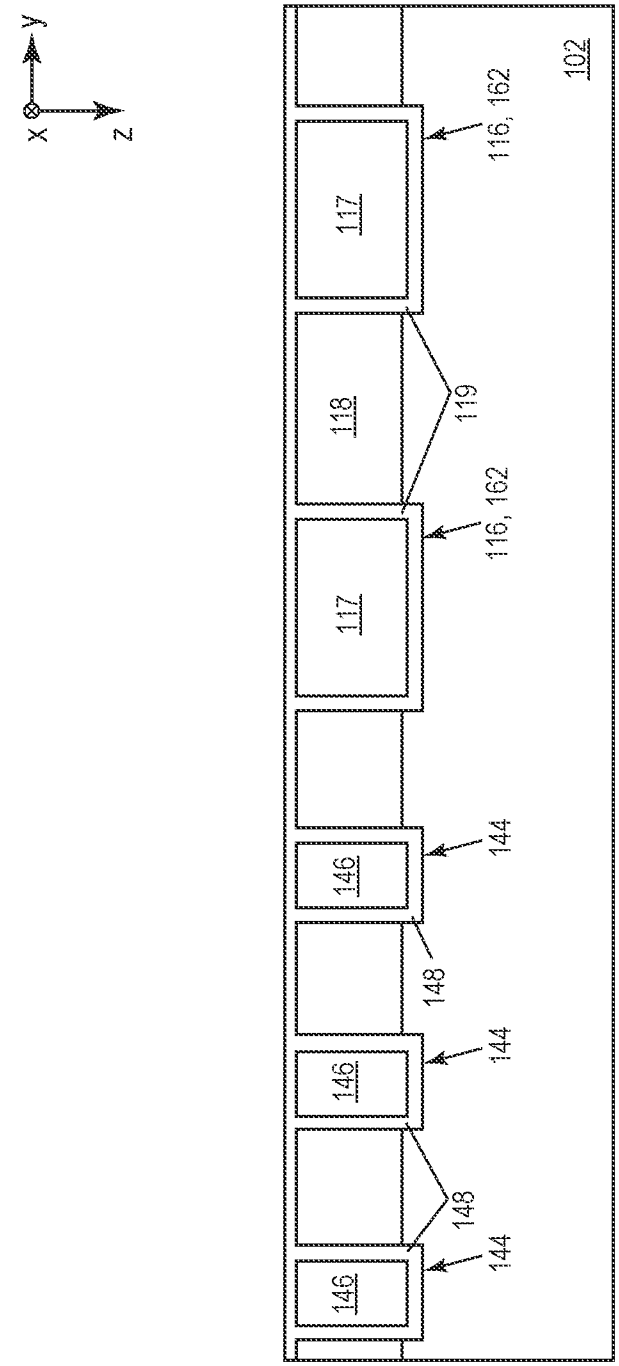

FIG. 10C shows the body region 118 blanket implanted into the first main surface 120 of the semiconductor substrate 102, such that the body region 118 is present in the active cell region 106, the inactive region 114, and the termination region 104. The body region 118 is blanket implanted in that no mask is used to restrict the implantation of the body region dopant species into the semiconductor substrate 102.

Figure 10D:
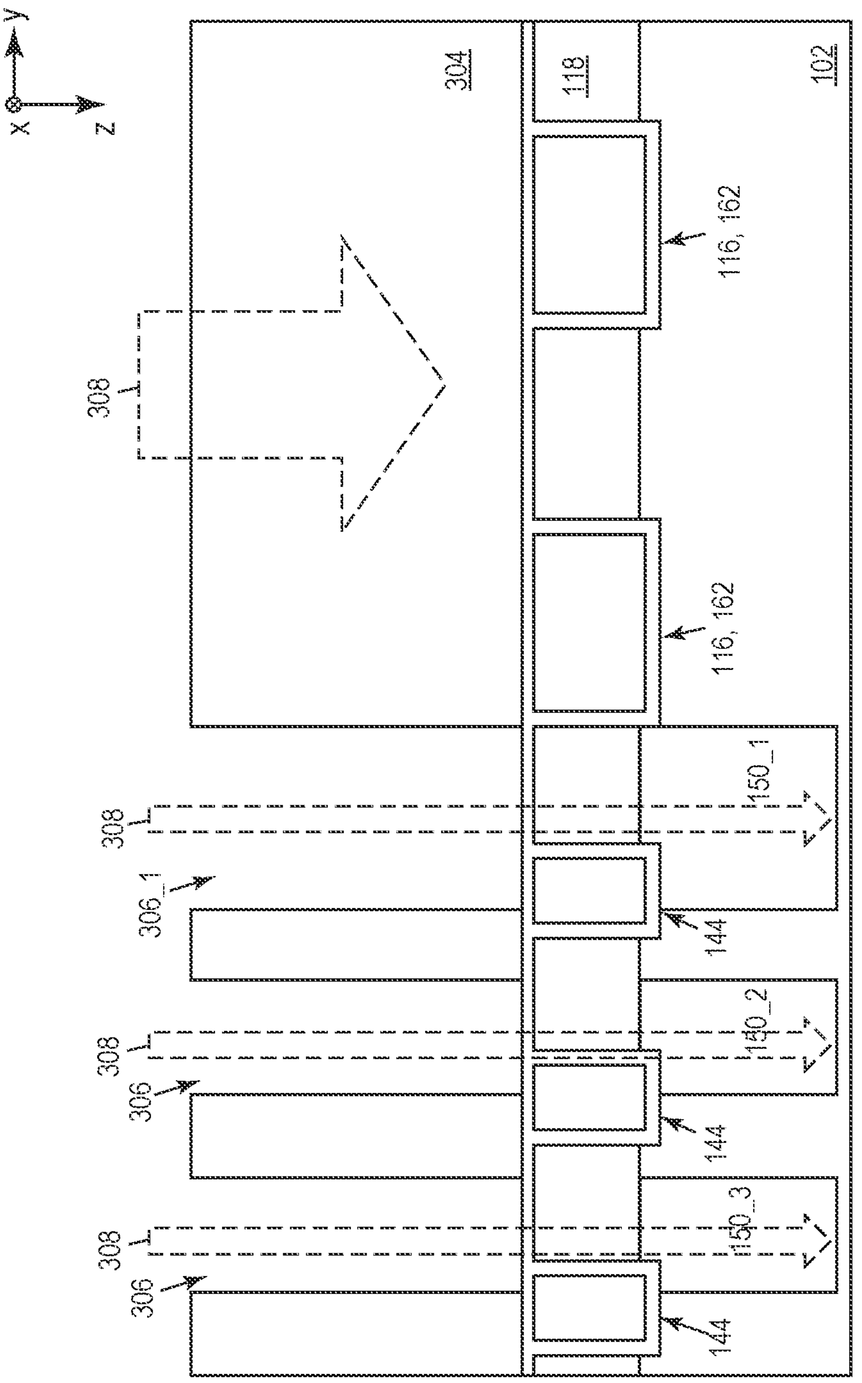

FIG. 10D shows the semiconductor substrate 102 during the implantation process that forms the doped potential drop regions 150 of the first conductivity type (i.e., same conductivity type as the body region 118) in the termination region 104. As explained above in connection with FIG. 9D, the implantation process includes forming a mask 304 on the semiconductor substrate 102. The mask 304 covers the first active cell region 106 and most or all of the gate connection part 162 of the gate trenches 116 in the inactive region 114. The mask 304 has openings 306 that define the location of the doped potential drop regions 150 to be formed in the termination region 104. One of the openings 306_1 slightly overlaps (e.g., less than ≤10%) one side of the gate connection part 162 of each gate trench 116 in the inactive region 114.

A dopant species 308 of the first conductivity type is then implanted into the semiconductor substrate 102 through each opening 306 in the mask 304. Most if not all of the gate connection part 162 of each gate trench 116 in the inactive region 114 is shielded from the dopant implant by the mask 304. Accordingly, the innermost doped potential drop region 150_1 that extends into the inactive region 114 partly overlaps (e.g., 10% or less) or does not overlap at all the gate connection part 162 of each gate trench 116 in the inactive region 114. As shown in FIG. 10D, there is a substantial part (e.g., 90% or more) of the semiconductor substrate 102 that adjoins the bottom of the gate connection part 162 of each gate trench 116 that does not receive the dopant species 308 that forms the innermost doped potential drop region 150_1 of the termination region 104.

The amount of mask opening overlap determines the amount of overlap, if any, between the doped potential drop region 150_1 and the gate connection part 162 of each gate trench 116 in the inactive region 114. The extension of the doped potential drop region 150_1 may adjoin and even slightly overlap (e.g., less than ≤10%) one or both ends of the gate connection part 162 of each gate trench 116 in the inactive region 114, e.g., as shown in FIGS. 4 and 6.

Figure 10E:
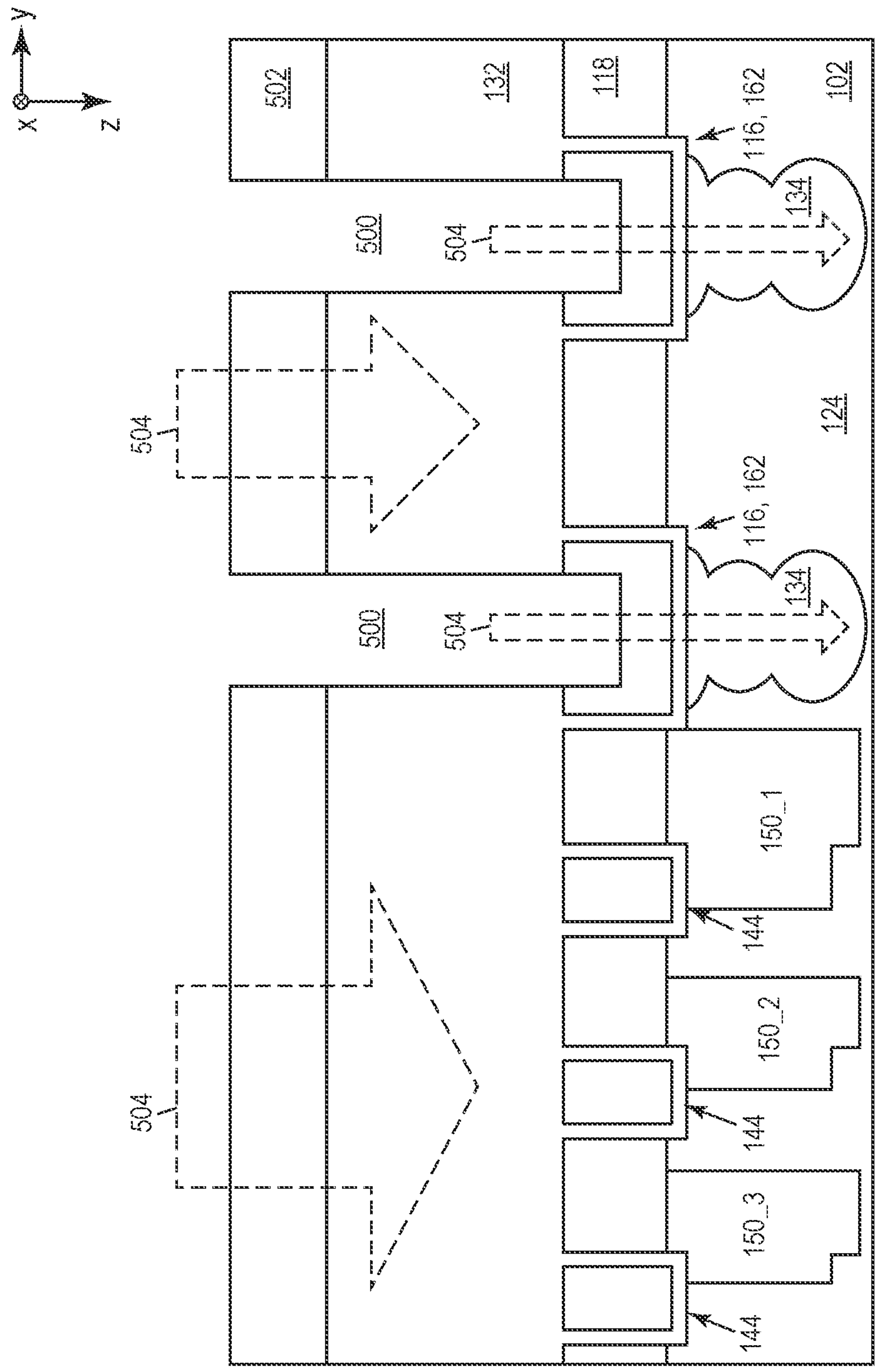

FIG. 10E shows the interlayer dielectric 132 formed on the semiconductor substrate 102 and contact openings 500 formed in the interlayer dielectric 132 that are aligned with the gate connection part 162 of each gate trench 116 in the inactive region 114. The contact openings 500 may be formed in the interlayer dielectric 132 using a photolithography process that involves the use of a photomask 502. The contact openings 500 in the interlayer dielectric 132 define source/body contact regions for the transistor device.

FIG. 10E also shows a superjunction implantation process which is separate from the potential drop region implantation process shown in FIG. 10D, and used to form the superjunction columns 134 of the first conductivity type in the first active cell region 106 to provide charge balance in conjunction with the surrounding semiconductor material 124 of the second conductivity type. The superjunction implantation process includes implanting a dopant species 504 of the first conductivity type into the semiconductor substrate 102 through each opening 500 in the interlayer dielectric 132 to form the superjunction columns 134 of the first conductivity type in the first active cell region 106. The superjunction columns 134 of the first conductivity type that are aligned with the contact openings 500 in the interlayer dielectric 132 and extend through the body region 118 into the drift region 124 of the second conductivity type. The mask 502 and interlayer dielectric 132 otherwise block the dopant species 504.

As shown in FIG. 10E, the dopant species 504 used to form the superjunction columns 134 of the first conductivity type in the first active cell region 106 also may be implanted into the semiconductor substrate 102 below the gate connection part 162 of each gate trench 116 in the inactive region 114. The doped potential drop region 150_1 of the termination region 104 that extends into the inactive region 114 has little to no overlap (e.g., less than ≤10%) with the implanted region of the first conductivity type formed under the gate connection part 162 of each gate trench 116 in the inactive region 114.

Figure 10F:
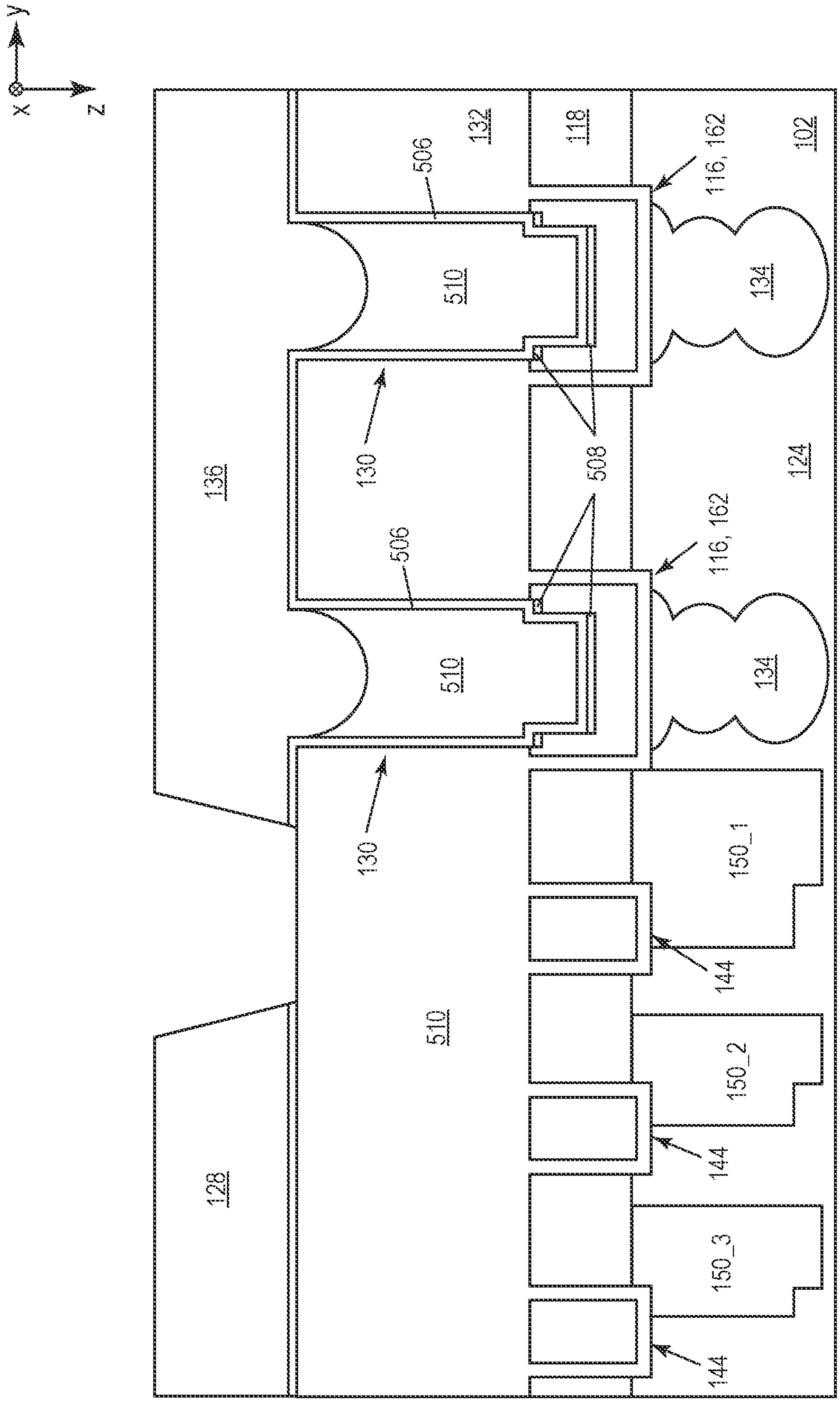

FIG. 10F shows the semiconductor die after the contact structure 130 is formed in the interlayer dielectric 132, and the source metallization 128 and the gate metallization 136 are formed on the interlayer dielectric 132. The contract structure 130 may include a Ti/TiN liner 506 formed on the interlayer dielectric 132 and lining the sidewalls and bottoms of the contact openings 500. A $TiSi_2$ silicide 508 forms where Ti comes into contact with Si and forms a low ohmic contact. A metal filler 510 such as tungsten (W) fills the remaining space in the contact openings 500. The structured power metallization, which includes the source metallization 128 and the gate metallization 136, is the formed on the interlayer dielectric 132 and the contact structure 130.

Although the present disclosure is not so limited, the following numbered examples demonstrate one or more aspects of the disclosure.

Example 1. A transistor device, comprising: a semiconductor substrate comprising a termination region interposed between a first active cell region and an edge of the semiconductor substrate; and a plurality of transistor cells in the first active cell region, each transistor cell comprising a gate trench formed in a body region of a first conductivity type; wherein the body region extends into the termination region, wherein the termination region comprises: a first termination trench laterally surrounding the first active cell region and extending through the body region so that the body region is interrupted in the termination region by the first termination trench; and a first doped region of the first conductivity type that follows the first termination trench and adjoins part of a bottom of the first termination trench, the first doped region terminating deeper in the semiconductor substrate than the body region and being off-center to a longitudinal centerline of the first termination trench.

Example 2. The transistor device of example 1, wherein the termination region further comprises: a second termination trench laterally surrounding the first termination trench and extending through the body region so that the body region is interrupted in the termination region by the second termination trench; and a second doped region of the first conductivity type that follows the second termination trench and adjoins part of a bottom of the second termination trench, the second doped region terminating deeper in the semiconductor substrate than the body region and being off-center to a longitudinal centerline of the second termination trench.

Example 3. The transistor device of example 2, wherein the first doped region covers a first percentage of the bottom of the first termination trench along a length of the first termination trench, wherein the second doped region covers a second percentage of the bottom of the second termination trench along a length of the second termination trench, and wherein the first percentage is greater than the second percentage.

Example 4. The transistor device of example 3, wherein the first percentage is 75% and the second percentage is 50%.

Example 5. The transistor device of any of examples 2 through 4, wherein the first doped region covers 0.4 μm to 0.5 μm of the bottom of the first termination trench along a length of the first termination trench, and wherein the second doped region covers 0.25 μm to 0.35 μm of the bottom of the second termination trench along a length of the second termination trench.

Example 6. The transistor device of any of examples 2 through 5, wherein the termination region further comprises: a third termination trench laterally surrounding the second termination trench and extending through the body region so that the body region is interrupted in the termination region by the third termination trench; and a third doped region of the first conductivity type that follows the third termination trench and adjoins part of a bottom of the third termination trench, the third doped region terminating deeper in the semiconductor substrate than the body region and being off-center to a longitudinal centerline of the third termination trench.

Example 7. The transistor device of example 6, wherein the first doped region covers a first percentage of the bottom of the first termination trench along a length of the first termination trench, wherein the second doped region covers a second percentage of the bottom of the second termination trench along a length of the second termination trench, wherein the third doped region covers a third percentage of the bottom of the third termination trench along a length of the third termination trench, wherein the first percentage is greater than the second percentage, and wherein the second percentage is greater than the third percentage.

Example 8. The transistor device of example 7, wherein the first percentage is greater than 50%, the second percentage is about 50%, and the third percentage is less than the second percentage.

Example 9. The transistor device of any of examples 6 through 8, wherein the first doped region covers 0.4 μm to 0.5 μm of the bottom of the first termination trench along a length of the first termination trench, wherein the second doped region covers 0.25 μm to 0.35 μm of the bottom of the second termination trench along a length of the second termination trench, and wherein the third doped region covers 0.1 μm to 0.2 μm of the bottom of the third termination trench along a length of the third termination trench.

Example 10. The transistor device of any of examples 6 through 9, wherein the first doped region covers a first percentage of the bottom of the first termination trench along a length of the first termination trench, wherein the second doped region covers a second percentage of the bottom of the second termination trench along a length of the second termination trench, wherein the third doped region covers a third percentage of the bottom of the third termination trench along a length of the third termination trench, wherein the first percentage is less than or equal to the second percentage, and wherein the second percentage is less than or equal to the third percentage.

Example 11. The transistor device of any of examples 6 through 10, wherein the first doped region that follows the first termination trench is connected to source potential, and wherein both the second doped region that follows the second termination trench and the third doped region that follows the third termination trench are electrically floating.

Example 12. The transistor device of any of examples 1 through 11, wherein the first doped region covers less than 100% and more than 50% of the bottom of the first termination trench along a length of the first termination trench.

Example 13. The transistor device of any of examples 1 through 12, wherein the first termination trench includes an electrically conductive material separated from the semiconductor substrate by an electrically insulative material, and wherein the electrically conductive material in the first termination trench is electrically floating.

Example 14. The transistor device of any of examples 1 through 13, wherein the semiconductor substrate further comprises a second active cell region that shares the gate trenches of the transistor cells with the first active cell region, wherein the termination region is interposed between the second active cell region and the edge of the semiconductor substrate, and wherein the first termination trench encircles the first active cell region and the second active cell region.

Example 15. The transistor device of example 14, further comprising: an interlayer dielectric on the semiconductor substrate; and a gate metal runner on the interlayer dielectric above an inactive region of the semiconductor substrate that separates the first active cell region and the second active cell region from one another, wherein the gate trenches extend from the first active cell region into the second active cell region through the inactive region, wherein the gate metal runner is connected to an electrically conductive material in the gate trenches through respective contact openings in the interlayer dielectric, wherein the gate trenches have a part in the inactive region where the gate metal runner is connected to the electrically conductive material in the gate trenches, wherein an implanted region of the first conductivity type is formed in the inactive region below the part of the gate trenches where the gate metal runner is connected to the electrically conductive material in the gate trenches.

Example 16. The transistor device of example 15, wherein the first termination trench adjoins the first active cell region, the second active cell region, and the inactive cell region, and wherein the first doped region of the first conductivity type that follows the first termination trench extends into the inactive region and either partly but not completely overlaps the implanted region or does not overlap the implanted region at all.

Example 17. The transistor device of any of examples 14 through 16, wherein the first active cell region and the second active cell region both have a stepwise profile along a border with the inactive cell region, wherein the first termination trench adjoins the first active cell region, the second active cell region, and the inactive cell region, and wherein the first doped region of the first conductivity type that follows the first termination trench extends into the inactive region and follows the stepwise profile of the first active cell region and the second active cell region.

Example 18. The transistor device of any of examples 1 through 17, further comprising: an interlayer dielectric on the semiconductor substrate; a contact to the body region of the first conductivity type and a source region of a second conductivity type opposite the first conductivity type of each transistor cell, each contact being disposed in a respective contact opening in the interlayer dielectric; and an implanted region of the first conductivity type aligned with each contact opening and extending through the body region into a drift region of the second conductivity type disposed below the body region.

Example 19. The transistor device of any of examples 1 through 18, wherein the first doped region starts from a corner of the bottom of the first termination trench and is off-center to the longitudinal centerline of the first termination trench.

Example 20. A method of producing a transistor device, the method comprising: blanket implanting a body region of a first conductivity type into a first active cell region and a termination region of a semiconductor substrate, the termination region being interposed between the first active cell region and an edge of the semiconductor substrate; forming a plurality of transistor cells in the first active cell region, each transistor cell comprising a gate trench formed in the body region; forming, in the termination region, a first termination trench that laterally surrounds the first active cell region and extends through the body region so that the body region is interrupted in the termination region by the first termination trench; and forming a first doped region of the first conductivity type that follows the first termination trench and adjoins part of a bottom of the first termination trench, the first doped region terminating deeper in the semiconductor substrate than the body region and being off-center with reference to a longitudinal centerline of the first termination trench.

Example 21. The method of example 20, wherein forming the first doped region of the first conductivity type that follows the first termination trench comprises: forming a mask on the semiconductor substrate that covers the first active cell region and has an opening that partly overlaps one side of the first termination trench; and implanting a dopant species of the first conductivity type into the semiconductor substrate through the opening in the mask.

Example 22. The method of example 21, further comprising: forming an interlayer dielectric on the semiconductor substrate; forming a gate metal runner on the interlayer dielectric above an inactive region of the semiconductor substrate that separates the first active cell region and a second active cell region of the semiconductor substrate from one another, wherein the gate trenches extend from the first active cell region into the second active cell region through the inactive region; connecting the gate metal runner to an electrically conductive material in the gate trenches through respective contact openings in the interlayer dielectric, wherein the gate trenches have a part in the inactive region where the gate metal runner is connected to the electrically conductive material in the gate trenches; and prior to forming the interlayer dielectric, implanting the dopant species of the first conductivity type into the inactive region through an additional opening in the mask that at least partly covers the part of the gate trenches where the gate metal runner is to be connected to the electrically conductive material in the gate trenches.

Example 23. The method of any of examples 20 through 22, further comprising: forming an interlayer dielectric on the semiconductor substrate; forming contact openings in the interlayer dielectric that are aligned with a source region of a second conductivity type opposite the first conductivity type of the transistor cells; and implanting a dopant species of the first conductivity type into the semiconductor substrate through the contact openings in the interlayer dielectric, to form implanted regions of the first conductivity type that are aligned with the contact openings and extend through the body region into a drift region of the second conductivity type disposed below the body region, wherein the first doped region of the first conductivity type that follows the first termination trench is formed by a first implantation process and the implanted regions of the first conductivity type are formed by a second implantation process performed after the first implantation process.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

The expression "and/or" should be interpreted to cover all possible conjunctive and disjunctive combinations, unless expressly noted otherwise. For example, the expression "A and/or B" should be interpreted to mean only A, only B, or both A and B. The expression "at least one of" should be interpreted in the same manner as "and/or", unless expressly noted otherwise. For example, the expression "at least one of A and B" should be interpreted to mean only A, only B, or both A and B.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A transistor device, comprising:

a semiconductor substrate comprising a termination region interposed between a first active cell region and an edge of the semiconductor substrate; and a plurality of transistor cells in the first active cell region, each transistor cell comprising a gate trench formed in a body region of a first conductivity type;

wherein the body region extends into the termination region, wherein the termination region comprises:

a first termination trench laterally surrounding the first active cell region and extending through the body region so that the body region is interrupted in the termination region by the first termination trench; and a first doped region of the first conductivity type that follows the first termination trench and adjoins part of a bottom of the first termination trench, the first doped region terminating deeper in the semiconductor substrate than the body region and being off-center to a longitudinal centerline of the first termination trench.

2. The transistor device of claim 1, wherein the termination region further comprises:

a second termination trench laterally surrounding the first termination trench and extending through the body region so that the body region is interrupted in the termination region by the second termination trench; and a second doped region of the first conductivity type that follows the second termination trench and adjoins part of a bottom of the second termination trench, the second doped region terminating deeper in the semiconductor substrate than the body region and being off-center to a longitudinal centerline of the second termination trench.

3. The transistor device of claim 2, wherein the first doped region covers a first percentage of the bottom of the first termination trench along a length of the first termination trench, wherein the second doped region covers a second percentage of the bottom of the second termination trench along a length of the second termination trench, and wherein the first percentage is greater than the second percentage.

4. The transistor device of claim 3, wherein the first percentage is 75% and the second percentage is 50%.

5. The transistor device of claim 2, wherein the first doped region covers 0.4 μm to 0.5 μm of the bottom of the first termination trench along a length of the first termination trench, and wherein the second doped region covers 0.25 μm to 0.35 μm of the bottom of the second termination trench along a length of the second termination trench.

6. The transistor device of claim 2, wherein the termination region further comprises:

a third termination trench laterally surrounding the second termination trench and extending through the body region so that the body region is interrupted in the termination region by the third termination trench; and a third doped region of the first conductivity type that follows the third termination trench and adjoins part of a bottom of the third termination trench, the third doped region terminating deeper in the semiconductor substrate than the body region and being off-center to a longitudinal centerline of the third termination trench.

7. The transistor device of claim 6, wherein the first doped region covers a first percentage of the bottom of the first termination trench along a length of the first termination trench, wherein the second doped region covers a second percentage of the bottom of the second termination trench along a length of the second termination trench, wherein the third doped region covers a third percentage of the bottom of the third termination trench along a length of the third termination trench, wherein the first percentage is greater than the second percentage, and wherein the second percentage is greater than the third percentage.

8. The transistor device of claim 7, wherein the first percentage is greater than 50%, the second percentage is about 50%, and the third percentage is less than the second percentage.

9. The transistor device of claim 6, wherein the first doped region covers 0.4 μm to 0.5 μm of the bottom of the first termination trench along a length of the first termination trench, wherein the second doped region covers 0.25 μm to 0.35 μm of the bottom of the second termination trench along a length of the second termination trench, and wherein the third doped region covers 0.1 μm to 0.2 μm of the bottom of the third termination trench along a length of the third termination trench.

10. The transistor device of claim 6, wherein the first doped region covers a first percentage of the bottom of the first termination trench along a length of the first termination trench, wherein the second doped region covers a second percentage of the bottom of the second termination trench along a length of the second termination trench, wherein the third doped region covers a third percentage of the bottom of the third termination trench along a length of the third termination trench, wherein the first percentage is less than or equal to the second percentage, and wherein the second percentage is less than or equal to the third percentage.

11. The transistor device of claim 6, wherein the first doped region that follows the first termination trench is connected to source potential, and wherein both the second doped region that follows the second termination trench and the third doped region that follows the third termination trench are electrically floating.

12. The transistor device of claim 1, wherein the first doped region covers less than 100% and more than 50% of the bottom of the first termination trench along a length of the first termination trench.

13. The transistor device of claim 1, wherein the first termination trench includes an electrically conductive material separated from the semiconductor substrate by an electrically insulative material, and wherein the electrically conductive material in the first termination trench is electrically floating.

14. The transistor device of claim 1, wherein the semiconductor substrate further comprises a second active cell region that shares the gate trenches of the transistor cells with the first active cell region, wherein the termination region is interposed between the second active cell region and the edge of the semiconductor substrate, and wherein the first termination trench encircles the first active cell region and the second active cell region.

15. The transistor device of claim 14, further comprising:

an interlayer dielectric on the semiconductor substrate; and a gate metal runner on the interlayer dielectric above an inactive region of the semiconductor substrate that separates the first active cell region and the second active cell region from one another, wherein the gate trenches extend from the first active cell region into the second active cell region through the inactive region, wherein the gate metal runner is connected to an electrically conductive material in the gate trenches through respective contact openings in the interlayer dielectric, wherein the gate trenches have a part in the inactive region where the gate metal runner is connected to the electrically conductive material in the gate trenches, wherein an implanted region of the first conductivity type is formed in the inactive region below the part of the gate trenches where the gate metal runner is connected to the electrically conductive material in the gate trenches.

16. The transistor device of claim 15, wherein the first termination trench adjoins the first active cell region, the second active cell region, and the inactive cell region, and wherein the first doped region of the first conductivity type that follows the first termination trench extends into the inactive region and either partly but not completely overlaps the implanted region or does not overlap the implanted region at all.

17. The transistor device of claim 14, wherein the first active cell region and the second active cell region both have a stepwise profile along a border with the inactive cell region, wherein the first termination trench adjoins the first active cell region, the second active cell region, and the inactive cell region, and wherein the first doped region of the first conductivity type that follows the first termination trench extends into the inactive region and follows the stepwise profile of the first active cell region and the second active cell region.

18. The transistor device of claim 1, further comprising:

an interlayer dielectric on the semiconductor substrate;

a contact to the body region of the first conductivity type and a source region of a second conductivity type opposite the first conductivity type of each transistor cell, each contact being disposed in a respective contact opening in the interlayer dielectric; and an implanted region of the first conductivity type aligned with each contact opening and extending through the body region into a drift region of the second conductivity type disposed below the body region.

19. The transistor device of claim 1, wherein the first doped region starts from a corner of the bottom of the first termination trench and is off-center to the longitudinal centerline of the first termination trench.

20. A method of producing a transistor device, the method comprising:

blanket implanting a body region of a first conductivity type into a first active cell region and a termination region of a semiconductor substrate, the termination region being interposed between the first active cell region and an edge of the semiconductor substrate;

forming a plurality of transistor cells in the first active cell region, each transistor cell comprising a gate trench formed in the body region;

forming, in the termination region, a first termination trench that laterally surrounds the first active cell region and extends through the body region so that the body region is interrupted in the termination region by the first termination trench; and forming a first doped region of the first conductivity type that follows the first termination trench and adjoins part of a bottom of the first termination trench, the first doped region terminating deeper in the semiconductor substrate than the body region and being off-center with reference to a longitudinal centerline of the first termination trench.

21. The method of claim 20, wherein forming the first doped region of the first conductivity type that follows the first termination trench comprises:

forming a mask on the semiconductor substrate that covers the first active cell region and has an opening that partly overlaps one side of the first termination trench; and implanting a dopant species of the first conductivity type into the semiconductor substrate through the opening in the mask.

22. The method of claim 21, further comprising:

forming an interlayer dielectric on the semiconductor substrate;

forming a gate metal runner on the interlayer dielectric above an inactive region of the semiconductor substrate that separates the first active cell region and a second active cell region of the semiconductor substrate from one another, wherein the gate trenches extend from the first active cell region into the second active cell region through the inactive region;

connecting the gate metal runner to an electrically conductive material in the gate trenches through respective contact openings in the interlayer dielectric, wherein the gate trenches have a part in the inactive region where the gate metal runner is connected to the electrically conductive material in the gate trenches; and prior to forming the interlayer dielectric, implanting the dopant species of the first conductivity type into the inactive region through an additional opening in the mask that at least partly covers the part of the gate trenches where the gate metal runner is to be connected to the electrically conductive material in the gate trenches.

23. The method of claim 20, further comprising:

forming an interlayer dielectric on the semiconductor substrate;

forming contact openings in the interlayer dielectric that are aligned with a source region of a second conductivity type opposite the first conductivity type of the transistor cells; and implanting a dopant species of the first conductivity type into the semiconductor substrate through the contact openings in the interlayer dielectric, to form implanted regions of the first conductivity type that are aligned with the contact openings and extend through the body region into a drift region of the second conductivity type disposed below the body region, wherein the first doped region of the first conductivity type that follows the first termination trench is formed by a first implantation process and the implanted regions of the first conductivity type are formed by a second implantation process performed after the first implantation process.

* * * * *